(12) United States Patent  
Bonora et al.

(10) Patent No.: US 6,298,280 B1  
(45) Date of Patent: Oct. 2, 2001

(54) METHOD FOR IN-CASSETTE WAFER CENTER DETERMINATION

(75) Inventors: Anthony C. Bonora, Menlo Park, CA (US); William J. Fosnight, Austin, TX (US); Krishna D. Swamy, Menlo Park, CA (US); Mark R. Davis, Mountain View, CA (US); Mike Cookson, San Jose, CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/162,334

(22) Filed: Sep. 28, 1998

(51) Int. Cl.[7] ....................................................... G06F 7/00
(52) U.S. Cl. ........................... 700/218; 414/941; 901/40; 901/47
(58) Field of Search ................ 700/218; 414/941, 414/937, 936; 901/35, 30, 40, 46, 47

(56) References Cited

U.S. PATENT DOCUMENTS

| | | | |
|---|---|---|---|
| 4,720,130 | * | 1/1988 | Andou ................................. 294/64.1 |
| 4,770,590 | * | 9/1988 | Hugues et al. ....................... 414/172 |
| 4,955,780 | * | 9/1990 | Shimane et al. ................... 414/744.2 |
| 5,004,399 | * | 4/1991 | Sullivan et al. ..................... 414/729 |
| 5,044,752 | * | 9/1991 | Thurfjell et al. .................... 356/400 |
| 5,740,059 | * | 4/1998 | Hirata et al. .................... 364/478.01 |
| 5,783,834 | * | 7/1998 | Shatas ................................ 250/559.33 |
| 5,813,819 | * | 9/1998 | Ohsawa et al. ..................... 414/416 |
| 5,870,488 | * | 2/1999 | Rush et al. ......................... 382/151 |
| 5,905,850 | * | 5/1999 | Kaveh .................................... 395/94 |
| 5,980,194 | * | 11/1999 | Freerks et al. ...................... 414/754 |
| 5,981,966 | * | 11/1999 | Honma ............................ 250/559.33 |
| 6,032,083 | * | 2/2000 | Oosawa ............................... 700/218 |
| 6,085,125 | * | 7/2000 | Genov ................................. 700/218 |
| 6,113,165 | * | 9/2000 | Wen et al. ............................. 294/1.1 |
| 6,116,848 | * | 9/2000 | Thomas et al. ..................... 414/754 |
| 6,126,381 | * | 10/2000 | Bacchi et al. ....................... 414/754 |

* cited by examiner

Primary Examiner—Joseph E. Valenza  
Assistant Examiner—Khoi H. Tran  
(74) Attorney, Agent, or Firm—Fliesler Dubb Meyer & Lovejoy LLP

(57) ABSTRACT

A system for positioning an end effector of a wafer handling robot with respect to a wafer to be extracted from a cassette, and for thereafter reading an indicial mark on the wafer. The system includes a pair of sensor units fixedly mounted on the end effector, which sensor units are capable of detecting the wafer edge upon approach of the end effector toward the wafer. Based on the positions of the end effector when the first and then the second sensor units detect the edge of the wafer, a computer may determine the orientation of the end effector with respect to the wafer, and adjust a position of the end effector to a center of the wafer. Thereafter, the indicial mark on the wafer may be read by a camera by withdrawing the wafer from the cassette on the end effector, positioning the center of the wafer over the central axis of rotation of the wafer handling robot, and rotating the robot until the indicial mark is located under the camera.

22 Claims, 15 Drawing Sheets

FIG. 4A
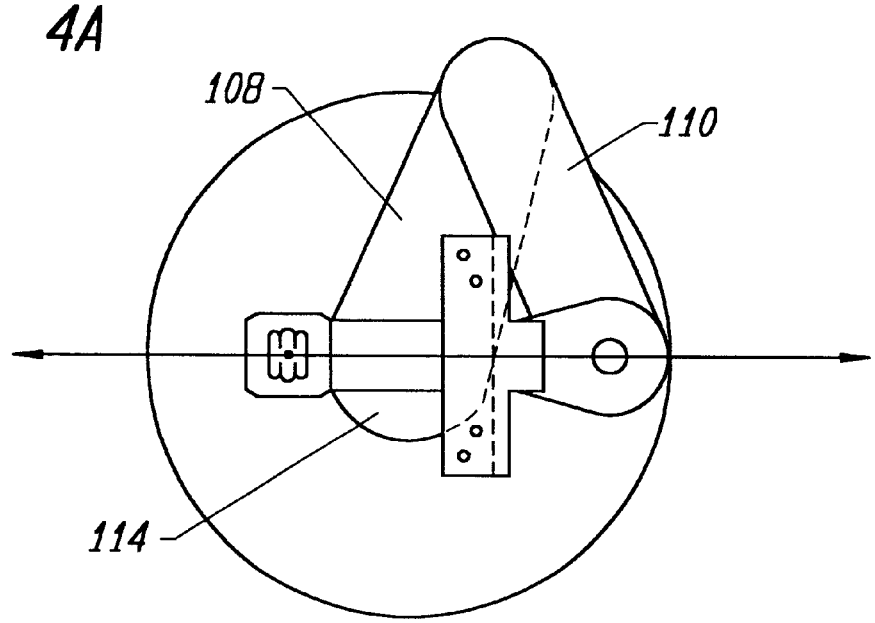
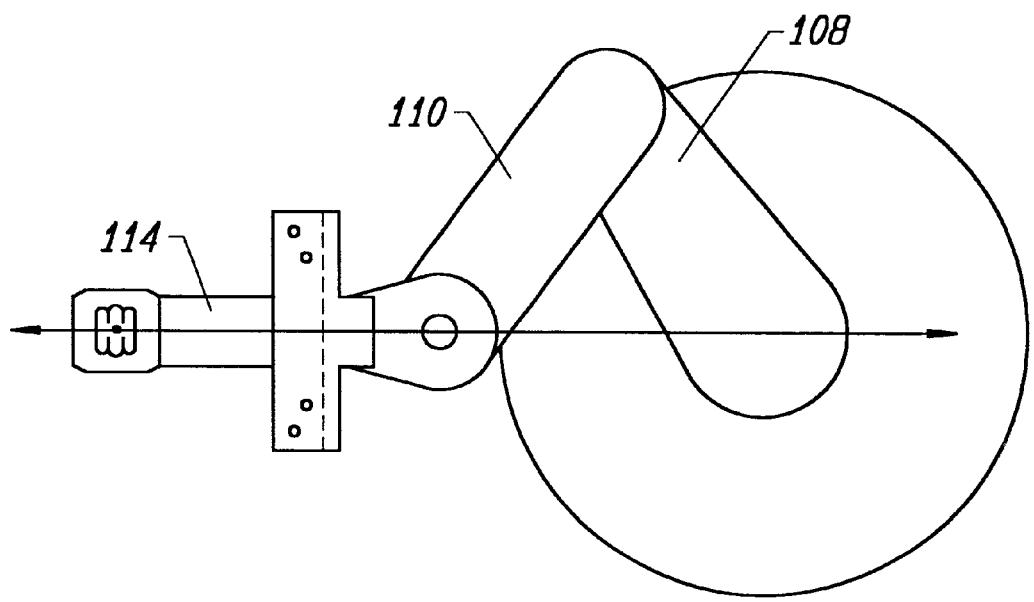
FIG. 4B

METHOD FOR IN-CASSETTE WAFER CENTER DETERMINATION

BACKGROUND OF THE INVENTION

1. Field of the Invention

The present invention relates to semiconductor wafer handling and processing equipment, and in particular, to a method and apparatus for positioning and orienting an end effector of a wafer handling robot with respect to a wafer to be extracted from a cassette, and for thereafter reading an indicial mark on the wafer.

2. Description of the Related Art

Standardized mechanical interface (SMIF) systems, first proposed by the Hewlett-Pac card Company and disclosed in U.S. Pat. Nos. 4,532,970 and 4,534,389, have now become accepted clean room equipment for semiconductor manufacturing. The purpose of the SMIF system is to reduce particle fluxes onto articles, for example, semiconductor wafers. This end is accomplished, in part, by mechanic ay ensuring that during transportation and storage the gaseous medium (such as air or nitrogen) surrounding the wafers is essentially stationary relative to the wafers and by ensuring that particles from the ambient environment do not enter the immediate wafer environment.

A SMIF system has three main components: (1) minimum volume, sealed pods used for storing and transporting wafer cassettes; (2) canopies placed over cassette pots and wafer processing areas of processing stations so that the environments inside the pods and canopies (upon being filled with clean air) become mixture clean spaces; and (3) a transfer mechanism to load/unload wafer cassettes from the sealed pods to the processing equipment without contamination of the wafers in the wafer cassette from external environments.

SMIF pods are in general comprised of a pod door which mates with a pod shell to provide a sealed environment in which wafers may be stored and transferred. So called "bottom opening" pods are known, where the pod door is horizontally provided at the bottom of the pod, and the wafers are supported in a cassette which is in turn supported on the pod door. It is also known to provide "front opening" pods, in which the pod door is located in a vertical plane, and the wafers are supported either in a cassette mounted within the pod shell, or to shelves mounted in the pod shell itself.

In order to transfer wafers between a SMIF pod and a process tool within a wafer fab, a pod typically loaded either manually or automatedly onto a load port on a from of the tool. The process tool includes an access port which, in the absence of a pod, is covered by a port door. Once the pod is positioned on the load port, mechanisms within the port door unlatch the pod door from the pod shell and move the pod door and port door together into the process tool where the doors are then moved away from the wafer transfer path and stowed. The pod shell remains in proximity to the interface port so as to maintain a clean environment including the interior of the process tool and the pod shell around the wafers. A wafer handling robot within the process tool may thereafter access particular wafers supported in wafer slots in the pod or cassette for transfer between the pod and the process tool. Alternatively, a bare cassette (without the pod) may be loaded directly onto the interface load port and transferred into the processing station by the wafer handling robot.

As wafers move through the various processing chambers within a semiconductor wafer fab, it is desirable to be able to track and locate a particular wafer at any given time. Moreover, it is desirable to be able to identify a particular wafer during wafer fabrication to ensure that the wafer is subjected only to processes appropriate for that wafer. This wafer tracking is accomplished by marking each wafer with an optical character recognition (OCR) mark, or similar indicia mark, which mark is read for each wafer prior to locating a wafer within a processing station. The indicial mark is typically a number or letter sequence etch into an upper surface of a wafer near the outer circumference by a laser or other suitable etching means. The indicial mark may alternatively be a bar code or a two dimensional dot matrix at an outer circumference of the wafer.

In order to read the indicial mark on a particular wafer, the indicial mark is conventionally positioned under an image identifying device such as a video camera, which acquires a computer-recognizable image of the indicial mark. The indicial mark must be precisely positioned under the video camera in order for the camera to acquire the image. This requirement is made more difficult by the fact that indicial marks are very small, so as not to take up space on the wafer otherwise sable for circuit devices.

Before an indicial mark may be read, the mark must first be located. When a wafer is seated within a wafer cassette, the orientation of the wafer to the cassette and to a tool for extracting and supporting the wafer is generally unknown. attempts have been made to align the indicial mark of each wafer at a particular rotational orientation within the cassette. However, because wafers move within a cassette upon handling and transfer of the cassette between processing stations, alignment of the indicial marks prior to transportation has not proved feasible. Conventionally, a separate operation has been devoted to orienting a wafer to a known location, locating the indicial mark, and aligning the indicial ark under the camera at or immediately prior to each station where it is desired to identify the particular wafers to be processed in that station.

In order to locate an indicial mark, wafers are conventionally formed with a notch, or flat on the outer edge of a wafer. For each wafer being processed, the indicial mark is located in a fixed, known relation to the notch, and by finding the notch, the precise location of the indicial mark may be determined. Conventionally, in order to locate the notch, the center of the wafer first has to be identified Thereafter, the wafer is rotated on center until a sensor proximate to the rotating wafer edge detects the notch.

FIG. 1 shows a conventional station 20 for performing this operation of wafer centering, notch location, and indicial mark reading. Such stations are conventionally located immediately upstream or as part of each processing station in the wafer fabrication process where the indicial mark is to be read. The station 20 includes a wafer handling robot 22 for accessing and transferring wafers 40 from a cassette 38. The robot 22 includes a shaft 26 mounted for rotation and translation along a z-axis concentric with the shaft axis of rotation. The robot 22 further includes a first arm 28 affixed to an upper end of shaft 26 for rotation with the shaft, and a second arm 30 pivotally attached to the opposite end of the first arm 28. The wafer handling robot further includes an end effector 32 Pivotally attached to the second arm 30. The robot 22 is controlled by a computer 36 such that end effector 32 slides into the wafer cassette 38 underneath one of the wafers 40, rises up to support the wafer 40, and thereafter retracts from the cassette with the wafer 40 supported thereon.

The robot 22 next transfers the wafer to an alignment module 42. The module 42 includes a table 44 capable of rotation and translation in a direction indicated arrow A—A in FIGS. 1 and 2A–2C. The robot 22 deposits the wafer on pins 52 FIGS. 2A–2C) around table 44, which pins thereafter retract to rest the w the table 44. Wafer 40 is then rotated on table 44 t o determine the radial of the wafer (i.e., the distance by which the center of the wafer deviates from the axis of rotation of table 44).

In order to determine the radial run out of wafer 44, the module 42 includes a sensor 48 having a plurality of optical transmitters 44a and a plurality of optical receivers 48b. After table 44 rotates wafer 40 360°, the computer 36 is able to determine the center of wafer 40 via the sensor 48.

Thereafter, the table rotates to align the axis of maximum radial runout with the direction translation of the table 44 (arrow A—A). Once the wafer 40 is positioned the pins 52 rise up and lift the wafer off of the table 44 (FIG. 2B). Table 44 then translates in a direction along arrow A—A to align the center of wafer 40 with the axis of rotation of table 44. Pins 52 then once again lower to deposit the wafer back onto the table 44, and table 44 translates back to its initial position FIG. 2C). The wafer 40 is then rotated on table 44 to ensure that the center wafer is aligned with the axis of rotation of the table. Once the center of the wafer has been determine d and aligned with that of table 44, wafer is rotated until the sensor 48 senses a notch formed in the wafer as de scribed above. The indicial mark is located in a known orientation with respect to the notch. As such, once the location of the center of the wafer and the location of the notch are known, the indicial mark may thereafter be positioned under and read by a video camera 46 also mounted on the module 42.

After the indicial mark has been read by the camera 46, the pins 52 lift the wafer off of the table 44. The end effector then slides in under the wafer, lifts the wafer off of the pins 52, and returns the wafer to the cassette 38. The entire operation is then repeated on the next subsequent wafer in the cassette.

The above-described conventional process of transferring a wafer to a prealignment module, identifying the center of a wafer, aligning the center of the wafer with the axis of rotation of table 44, and then positioning and reading the indicial mark is a time consuming process. Moreover, this process must be performed a each station where an indicial mark reading is required, and must be perform on each individual wafer at each of these stations. Another disadvantage conventional wafer centering and notch finding systems is that the alignment module conventionally used for determining and re-orienting the center of a wafer takes up critical space within the station 20. Station 20 must be provided with a clean room environment, which is difficult and expensive to maintain. As such it is important that the space within such an environment be used efficiently. Further still, conventional systems as described above determine an align the center of a wafer only after it has been extracted from the wafer cassette. However, initial extraction of a misaligned wafer may result in contact of the wafer with the sides of the cassette, which may result in damage to, or a complete loss of, that wafer.

For certain applications, it may be desired to center a wafer within a cassette, without necessarily having to read an indicial mark. In order to accomplish this at present, a wafer must be extracted from the cassette by a wafer handling robot, placed on a prealignment module 42 described above with respect to FIG. 1, and then returned to the cassette. Again, such a process is time consuming and the module takes up critical space within a clean room environment .

SUMMARY OF THE INVENTION

It is therefore an advantage of the present invention to provide an improved method and apparatus for reading an OCR or similar indicial mark.

It is a further advantage of the present invention to provide a method and apparatus for reading an indicial mark that requires less space within a clean room environment than that required in conventional systems.

It is another advantage of the present invention to provide a method and apparatus for reading an indicial mark in fewer steps than that required in conventional systems.

It is a further advantage of the present invention to provide an improved method and apparatus for positioning a wafer support tool under the center of a wafer.

It is a still further advantage of the present invention to identify the location of the center of a wafer without having to extract the wafer from a cassette in which the wafer is seated.

It is another advantage of the present invention to center a wafer support tool under a wafer prior to extracting the wafer from the cassette to prevent contact of the wafer with the cassette upon wafer extraction.

These and other advantages are accomplished by the present invention which is one embodiment relates to a system for centering an end effector of a wafer transfer robot with respect to a wafer while the wafer is seated in a cassette. The wafer handling robot may thereafter extract the wafer, align the known center of the wafer with the known axis of rotation of the wafer handling robot, and rotate the wafer until an OCR or other similar indicial mark is located under an image reading camera.

In order to center the end effector of the wafer handling robot with respect to a Wafer to be extracted from the cassette, the relative position between the end effector and the wafer must first be determined. For this purpose, an embodiment of the present invention includes a sensor system having a pair of sensor units. The sensor units are spaced apart along an arc generally perpendicular to the angle of approach of the end effector toward the cassette. In an embodiment of the invention, the sensor units each may comprise at least one conventional thru-beam sensor. The sensor units are provided to sense the edge of a wafer to be extracted as the end effector enters a cassette beneath the wafer.

The angle of approach of the end effector is controlled to initially position the end effector under an expected center of a wafer to be extracted. This position is generally where the center of a wafer would be if the wafer were centered within the cassette. If the wafer was properly centered, the sensor units would detect the edge of the wafer at substantially the same time as the end effector entered under the wafer. However, because the actual position of the wafer is likely to be off center, one sensor unit will likely detect the edge of the wafer before the other sensor unit. According to an embodiment of the present invention, after one sensor unit detects the edge of a wafer, the robot continues to advance the end effector until the second sensor unit detects the edge of the wafer. The distance the end effector travelled from edge detection by the first sensor unit to edge detection by the second sensor unit is known. Based on that known distance, the correct angle of approach to position the end effector under the true center of the wafer may be calculated. The angle of approach of the end effector will be corrected by a clockwise or counterclockwise rotation of the wafer handling robot, depending on which sensor unit detected the wafer edge first. Upon correcting the angle of approach, if the two sensor units do not detect the wafer edge at substantially the same time, the process may be repeated.

Once the end effector is centered with respect to a wafer, the wafer may be extracted from the cassette in a known relative position to the end effector. Thereafter, for embodiments of the invention where it is desired to read an indicial mark on a wafer, the robot positions the wafer such that the center of the wafer is aligned with an axis of rotation of the wafer handling robot. In an embodiment of the invention, a first video camera positioned above the wafer may thereafter be used to locate the notch in the outer circumference of the wafer. As the relative position between the wafer notch and the indicial mark is known, once the wafer center and the location of the notch have been identified, the wafer handling robot may rotate the wafer through a known angle to position the indicial mark under a second video camera capable of reading the indicial mark. Once the mark has been read, the wafer handling robot may return the wafer to the cassette. As the wafer is centered on the end effector, the robot may return the wafer to the cassette so that the wafer is centered within the cassette.

In some applications, it may be desired to center a wafer within a cassette without having to read an indicial mark. For such applications, according to an embodiment of the invention, after the end effector is centered under a wafer and the wafer his been lifted up, but still within the cassette, the wafer handling robot may correct the position of the wafer with respect to the cassette, and thereafter return the wafer to it support surface within the cassette so that the wafer is centered within the cassette.

BRIEF DESCRIPTION OF THE DRAWINGS

The invention will now be described with reference to the drawings in which:

FIGS. 4A and 4B are top views of a wafer handling robot according to the present invention showing the direction of motion of an end effector of the robot;

DETAILED DESCRIPTION

The invention will now be described with reference to FIGS. 3A–16, which in general disclose a system for determining the position and orientation between a wafer and a tool for supporting the wafer, and thereafter reading an indicial mark on the wafer. While the present invention is described with respect to circular semiconductor wafers, it is understood that the present invention may be used to locate the center of any of various workpieces of known dimensions, circular or otherwise. The present invention is described herein with respect to 200mm wafers. However, it is understood that the present invention may be used with wafers or workpieces of various sizes, and the dimensions set forth below will vary accordingly.

Figure 1:
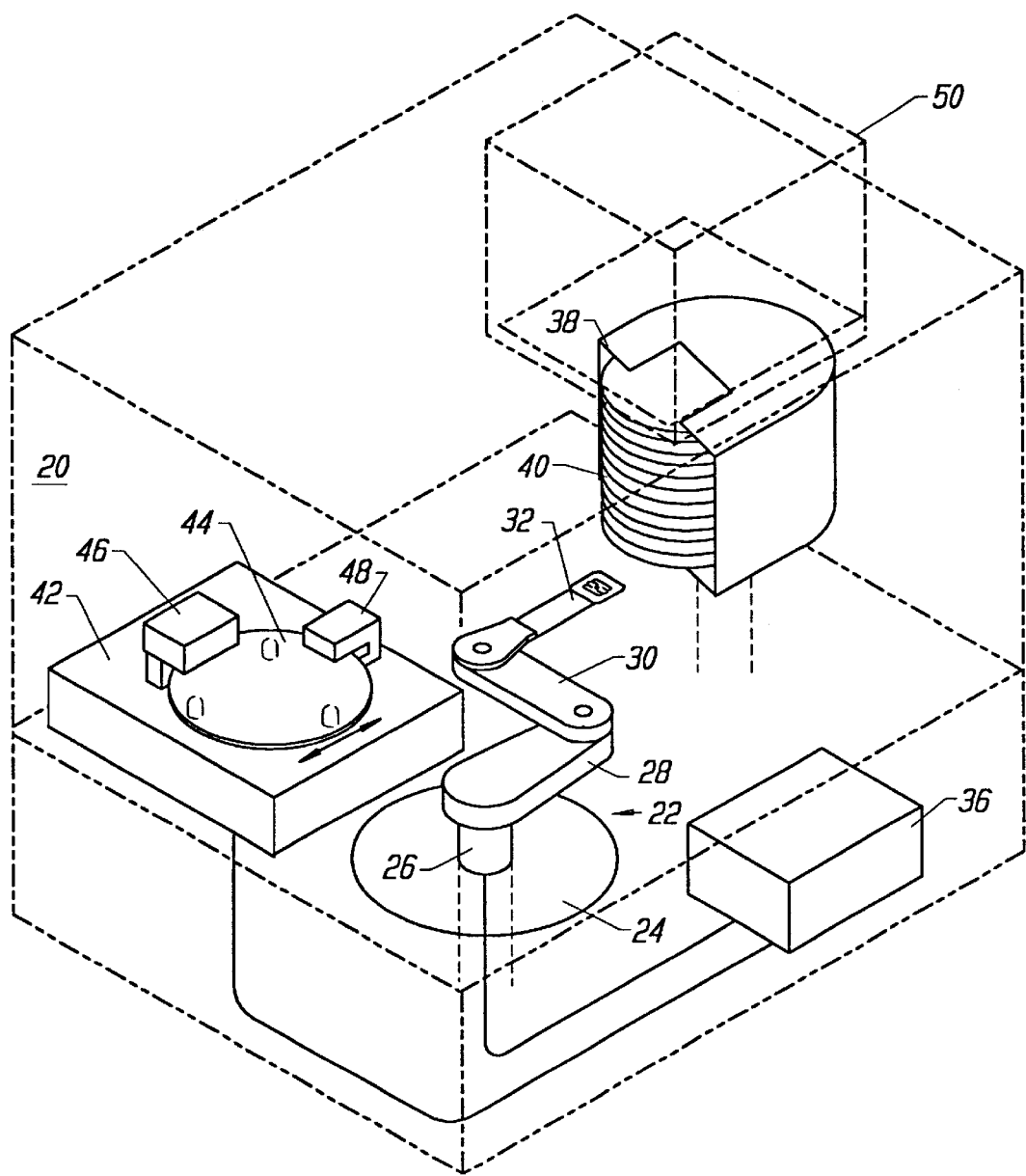
FIG. 1 shows a perspective view of a conventional system for reading an indicial mark on a wafer.
Figure 2A:
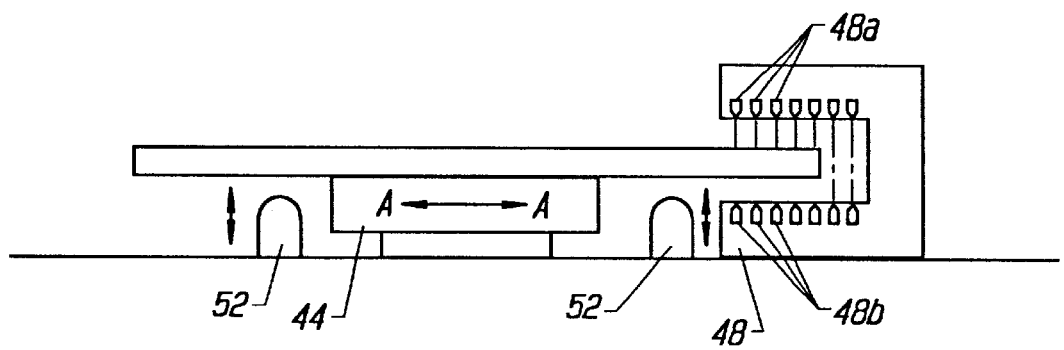
FIGS. 2A through 2C show side views of a conventional system for determining the center of a wafer and repositioning the center of the wafer with the axis of rotation of a supporting table.
Figure 2B:
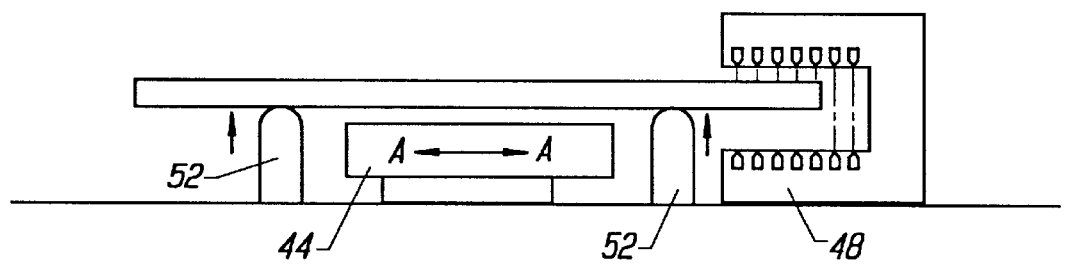
Figure 2C:
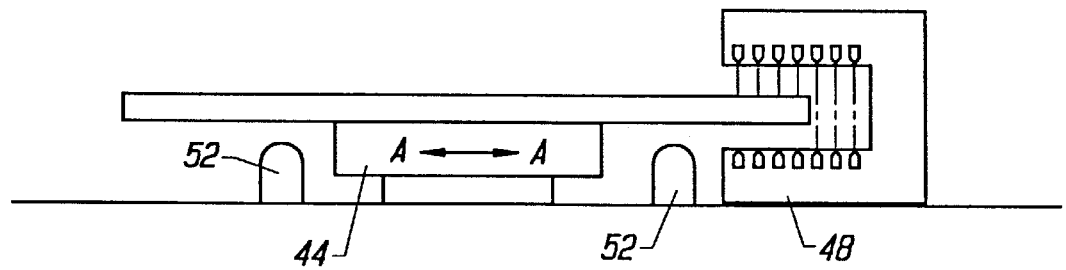
Figure 3A:
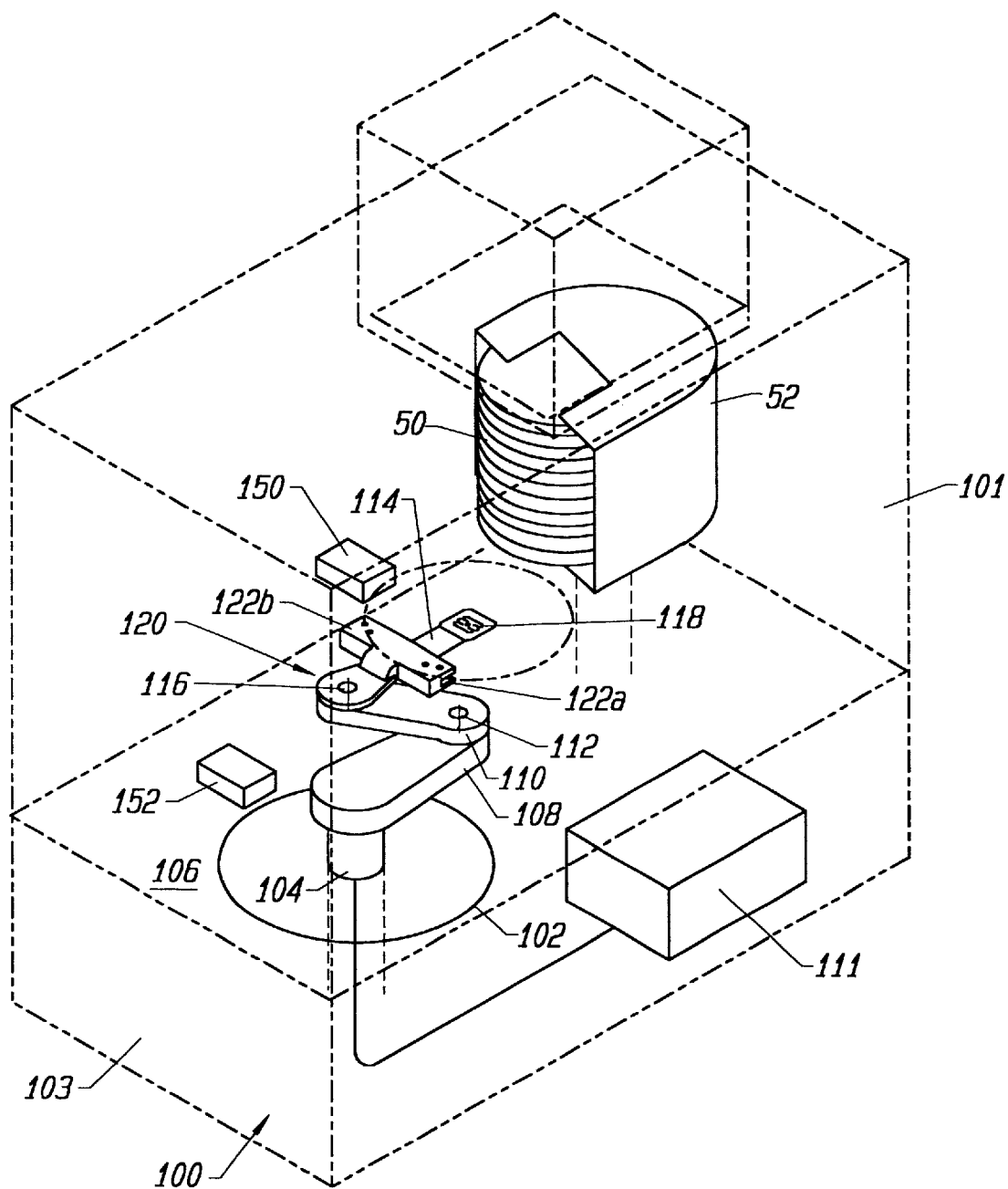
FIG. 3A is a perspective view of a system according to the present invention for determining and aligning the center of a wafer with respect to an end effector of a wafer handling robot.
Figure 3B:
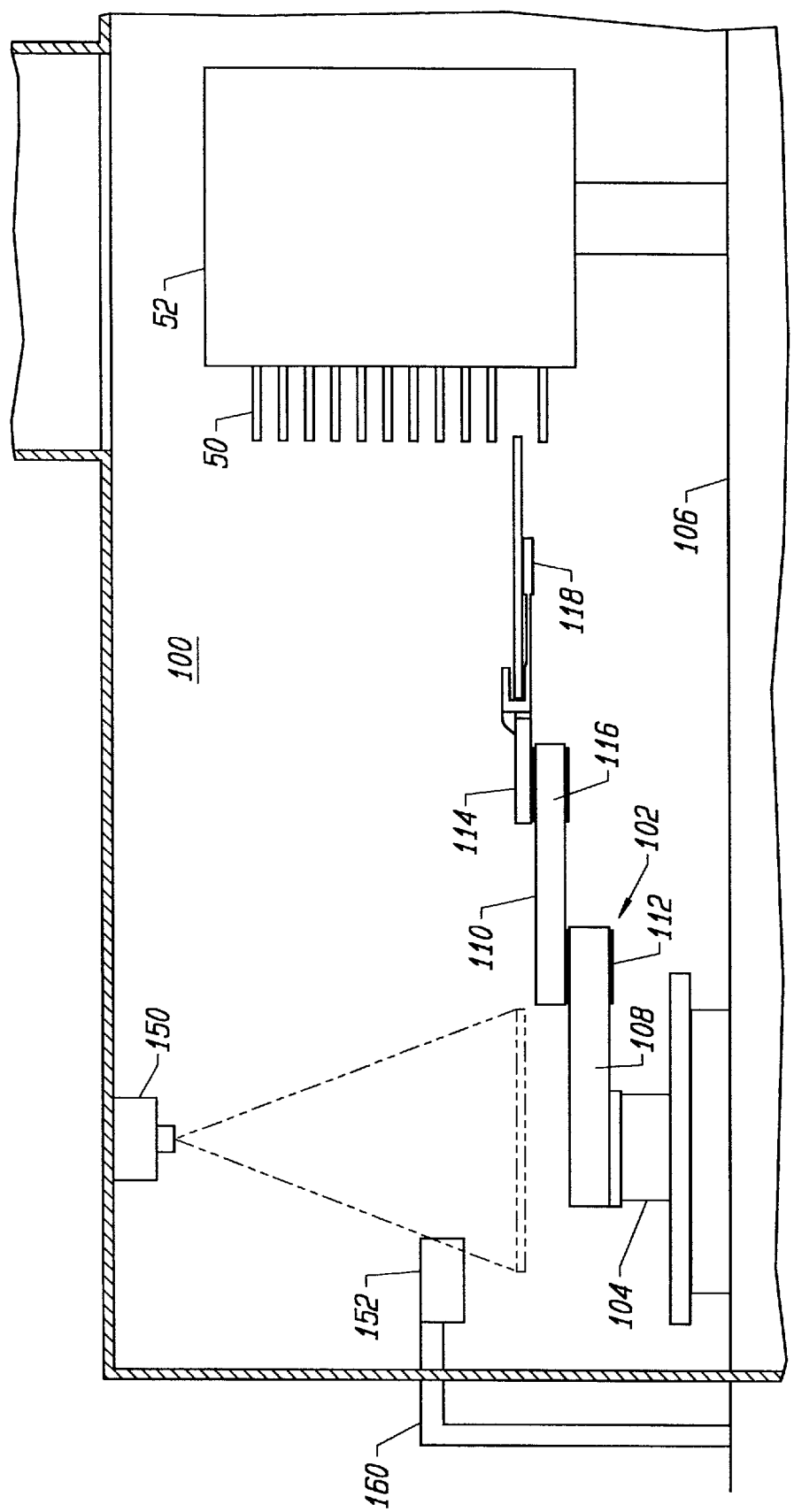
FIG. 3B is a side view of a system according to the present invention for determining and aligning the center of a wafer with respect to an end effector of a wafer handling robot.
Figure 5:
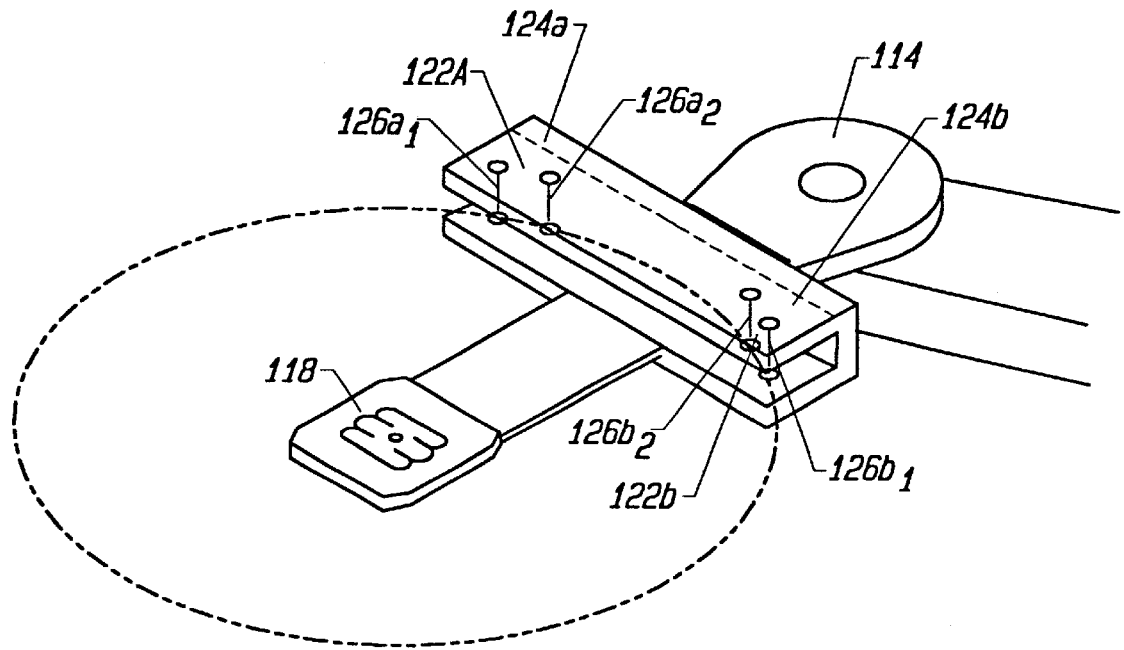
FIG. 5 is an enlarged perspective view of the system according to the present invention for determining and aligning the center of a wafer with respect to an end effector of a wafer handling robot.
Figure 6:
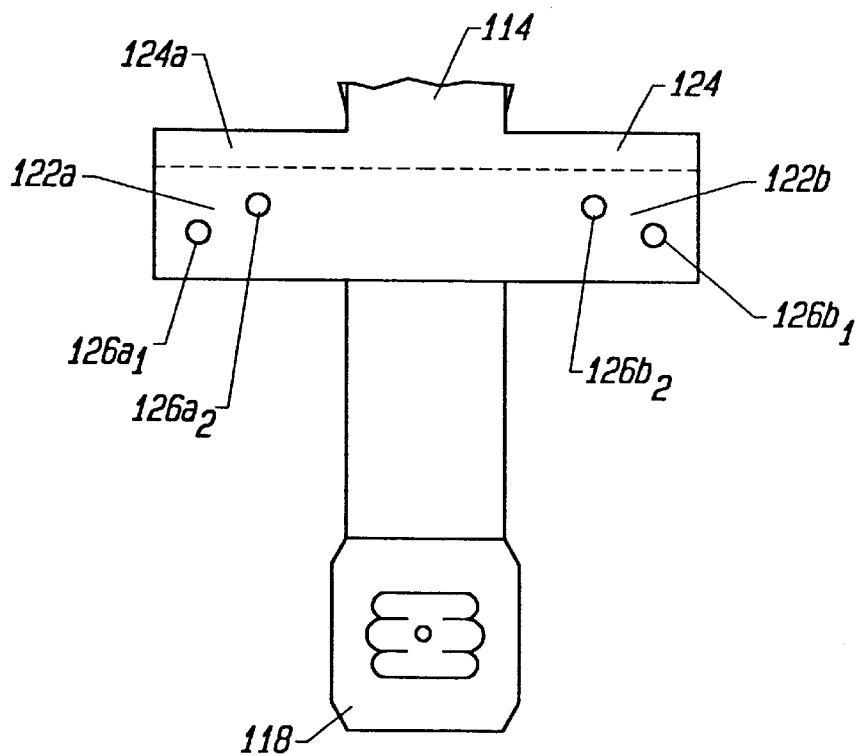
FIG. 6 is a top view of an end effector according to the present invention as shown in FIG. 5.

Referring now to FIGS. 3A and 3B, a processing station 100 includes a wafer handling area 101 including a floor 106, and a control area 103 beneath the floor 106 for housing a control unit and mechanical devices as described hereinafter. The wafer handling area 101 includes a wafer handling robot 102 for accessing wafers 50 from a support surface such as wafer cassette 52. The robot 102 incorporates many of the elements of the wafer handling robot 22 described above in the Background of the Invention section. In particular, wafer handling robot 102 includes a shaft 104 mounted through the floor 106 of the station 100. The shaft is rotatably supported on bearings within the control area, which bearings are in turn supported for translation along a z-axis concentric with an axis of rotation of the shaft 104. As a result, shaft 104 is capable of rotation about a z-axis and translation along the z-axis. In a preferred embodiment, the shaft 104 is preferably about 3.25 inches in diameter, and capable of translation from a zero elevation to a height of approximately 7.15 inches, although this translational range may vary in alternative embodiments. The shaft is preferably formed of a durable metal having low outgassing properties, such as for example aluminum with an anodized surface finish.

The wafer handling robot further includes a first arm 108 affixed to an upper end of shaft 104, and a second arm 110 pivotally attached to the first arm 108 at a mounting point 112. The first arm 108 is capable of fixed rotation on shaft 104 in a firs t x-y plane perpendicular to the z-axis of rotation of the shaft 104. The second 110 is capable of pivoting about its mounting point 112 on the first arm in i second x-y plane parallel to the first x-y plane. The wafer handling robot fur her includes a wafer support tool such as an end effector 114 pivotally attached to an end of the second arm 110 opposite the first arm. End effector 114 is capable of pivoting about a mounting point 116 on the second arm 110 in a third x-y plane parallel to the first and second x-y planes. In a preferred embodiment, the Distance from the z-axis of rotation in shaft 104 to the mounting point 112 of the first arm is approximately 5.25 inches, and the distance from the mounting point 112 to the mounting point 116 of the second arm is approximately 5.25 inches, although these dimensions may vary in alternative embodiments. The first arm, second arm and end effector are preferably formed of a light weight durable metal having low outgassing properties, such as, for example, aluminum with an anodized surface finish.

The end effector 114 includes a wafer support platform 118 at an end of the end effector opposite its mounting point to the second arm 110. The end effector is provided to enter into the cassette 52 in between adjacent wafers 50, move upwards (as a result of raising up of the shaft 104 along the z-axis) to lift a wafer off of its resting place within the cassette so that the wafer is supported on the wafer support platform 118, and then to withdraw the wafer from the cassette. The wafers may lie within the cassette on shelves that space the wafers approximately 0.250 inches from each other. Thus, in a preferred embodiment, the support platform has a thickness of approximately 0.07 to 0.1 inches, and optimally about 0.09 inches. The length of end effector 114 from its mounting point to the center of the support platform 118 is approximately 6.7 inches. It is understood that the thickness and length of the end effector may vary in alternative embodiments of the invention. As is known in the art, a vacuum source (not shown) may be provided in the control area 103 of the station 100, which creates a negative pressure that is communicated through the wafer handling robot to the surface of the wafer support platform 118. Upon activation of the vacuum source, a negative pressure is thus formed at the surface of the support platform 118 to hold a wafer firmly thereon.

Operation of the wafer handling robot 102 is controlled by a computer 111 provided within the control area 103 or located externally of the station 100 and connected therewith via electrical leads. With the shaft 104 capable of rotation and translation along a z-axis, and with the first arm 108, second arm 110, and end effector 114 all capable of pivoting about their respective mounting points in x-y planes perpendicular to the z-axis of rotation, the computer 111 may control the position of the wafer support platform 118 to maneuver through three-dimensional space within the station 100. The pivotal position of the first arm, second arm, and end effector are preferably controlled with respect to each other by a combination of the computer and mechanical linkages such that the end effector is constrained to move along radials emanating from the z-axis of rotation of the shaft 104. This feature is illustrated in FIGS. 4A and 4B.

While a particular embodiment of a wafer handling robot has been described above, it is understood that embodiments of the present invention can operate with various systems capable of extracting a wafer from a cassette, and repositioning the wafer to a desired location.

According to embodiments of the present invention, the wafer handling device 102 further includes a wafer centering sensor system 120 comprised of sensor units 122a and 122b.

Referring now to FIGS. 3A and 5–8, sensor units 122a and 122b are mounted on wings 124a and 124b, respectively, extending outward from end effector 114. The sensor unit 122a includes first sensor $126a_1$ and second sensor $126a_2$. Similarly, sensor unit 122b includes first sensor $126b_1$ and second sensor $126b_2$.

Figure 8:
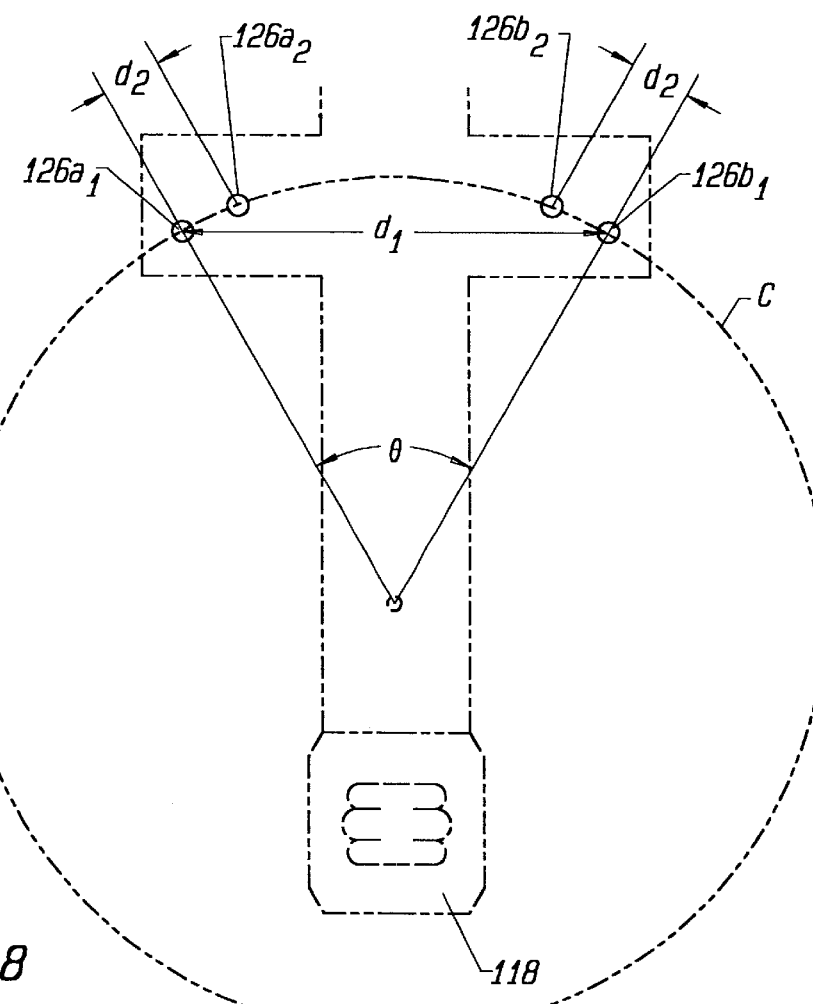
FIG. 8 is a schematic representation of the orientation of the sensors in the end effector according to the present invention.

As show in FIG. 8, in an embodiment of the invention operating with 200 mm wafers, sensors $126a_1$, $126a_2$, $126b_1$, and $126b_2$ preferably lie on the circumference of a circle C having a radius r=100 mm. The circumference of the circle C is preferably the same size as the wafers used in the process, and will therefore vary if wafers other than 200 mm are used. In a preferred embodiment, the outermost sensors, sensor $126a_1$ and sensor $126b_1$ lie on the circumference spaced apart from each other by an angle θ ranging between 60° and 100°, and optimally about 90°. With such an orientation, sensors $126a_1$ and $126b_1$ are spaced apart from each other by a distance $d_1=2r*\sin(\theta/2)$. For a radius of 100 mm, and an angle θ of 45°, the distance $d_1$=approximately 76.5 mm.

As will b explained in greater detail below, the sensors are provided to sense the edge of a wafer to be extracted as the end effector enters a cassette beneath the wafer. However, if the notch 156 conventionally formed in the wafer (FIGS. 12A–12C) is directly aligned with a sensor as the sensor encounters the edge of the wafer, the sensor will give a faulty indication of the detection of the wafer outer circumference. That is, the sensor would have correctly detected the wafer edge at an earlier point in time, had it not been aligned with the notch. Therefore, each sensor unit 122a, 122b includes two sensors ($126a_1$, $126a_2$ and $126b_1$, $126b_2$). The two sensors in any one of the sensor units 122a, 122b are spaced apart from each other along the circumference of circle C by a distance $d_2$ no less than the arc length of the notch 156 formed in the wafer. As such, when the end effector approaches a wafer, if one of the sensors, for example, 126a, of sensor unit 122a is partially or completely aligned with the wafer notch, the other sensor 126a of sensor unit 122a is guaranteed to provide a true indication of when the sensor unit 122a encounters the outer circumference of the wafer. The feedback from sensors $126a_1$, and $126a_2$ are logically ORed together within, for example, the computer 111 or a sensor amplifier, such that the sensor unit 122a will indicate a wafer edge detection if either sensor $126a_1$ or $126a_2$ senses the wafer edge. The same is true within the sensors of sensor unit 122b.

Figure 7:
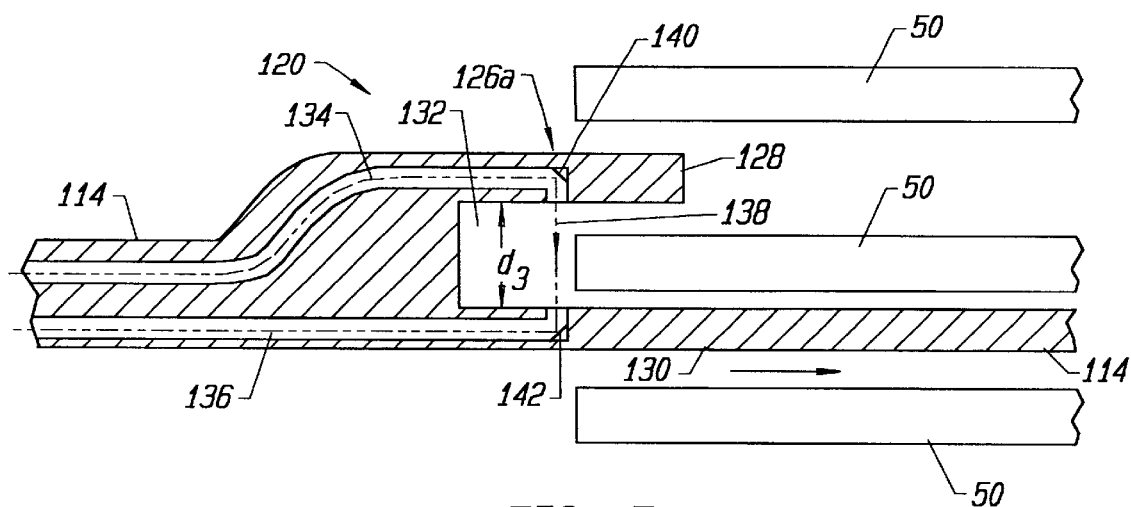
FIG. 7 is a side view of an end effector according to the present invention shown in relation to a plurality of wafers.

When viewed from the side as shown in FIG. 7, the wings 124a and 124b separate into an upper portion 128 and a lower portion 130 thus deforming a generally C-shaped opening 132. As the end effector 114 approaches a wafer 50 to be removed from the cassette, the upper portion 128 enters the cassette above the wafer 50 to De extracted, and the lower portion 130 enters below the wafer to be extracted. Upper and lower portions 128 and 130 must be spaced apart from each other by a distance $d_3$ so that the upper portion 128 and the wafer support platform 118 may enter above and below the wafer to be extracted without contacting the wafer, and also such that the upper and lower portions do not contact the wafers above or below the wafer being extracted. In a preferred embodiment the distance $d_3$ may range between 0.125 inches and 0.156 inches, and is optimally about 0.140 inches. The thicknesses of the upper and lower portions 128, 130 are preferably each about 0.09 inches, but these dimensions may vary in alternative embodiments of the invention.

In a preferred embodiment, each of the sensors $126a_1$, $126a_2$, $126b_1$ and $126b_2$ are structurally and operationally identical to each other, and therefore a single sensor, such as for example $126a_1$ will now be described with reference to FIG. 7. It is understood that the following description of sensor 126a is applicable to each of the other sensors. The sensor $126a_1$ may comprise a thru-beam sensor formed of a first optical fiber 134 for transmitting an optical signal 138 across gap 132, and a second optical fiber 136 for receiving the optical signal transmitted across gap 132.

As would be appreciated by those skilled in the art, the optical signal 138 travels through optical fiber 134 until the signal reaches an angled section 140 of the fiber 134. At section 140, at least a portion of the signal 138 is directed downward. Similarly, optical fiber 136 has an angled section 142 for receiving the optical signal 138 and redirecting it through optical fiber 136. As the end effector moves toward a wafer, at some point the optical signal 138 will be blocked by the wafer 50 edge. At that point, the signal through optical fiber 136 is shut down, thus indicating to the computer 111 that the sensor $126a_1$ has encountered the edge of the wafer. It is understood that the positions of the optical fibers 134 and 136 may be reversed with respect to the upper and lower portions 128 and 130 in an alternative embodiment. Moreover, while the above described system utilizes a thru-beam sensor, it is understood that various other sensors may be used as sensor $126a_1$. Such sensing systems include but are not limited to retroreflective systems for receiving a signal reflected off of the wafer upon encountering a wafer edge, sonar sensing systems, and video cameras.

Additionally, although the four sensors are structurally and operationally identical to each other in a preferred embodiment, it is understood that the sensors may be more or less than four, and may structurally and/or operationally differ from each other, in alternative embodiments of the invention. For example, instead of providing each sensor unit (126a, 126b) with two sensors, each sensor unit ay comprise a single emitter and a pair of receivers, or a single emitter and a single receiver. In such embodiments, as would be appreciated by those skilled in the art, mirrors and/or other optical devices may be provided for directing the beam of each sensor unit to sense the wafer edge at least two locations, to then,by account for the possibility that a sensor unit is aligned with the wafer notch, as previously explained.

Figures 9, 10:
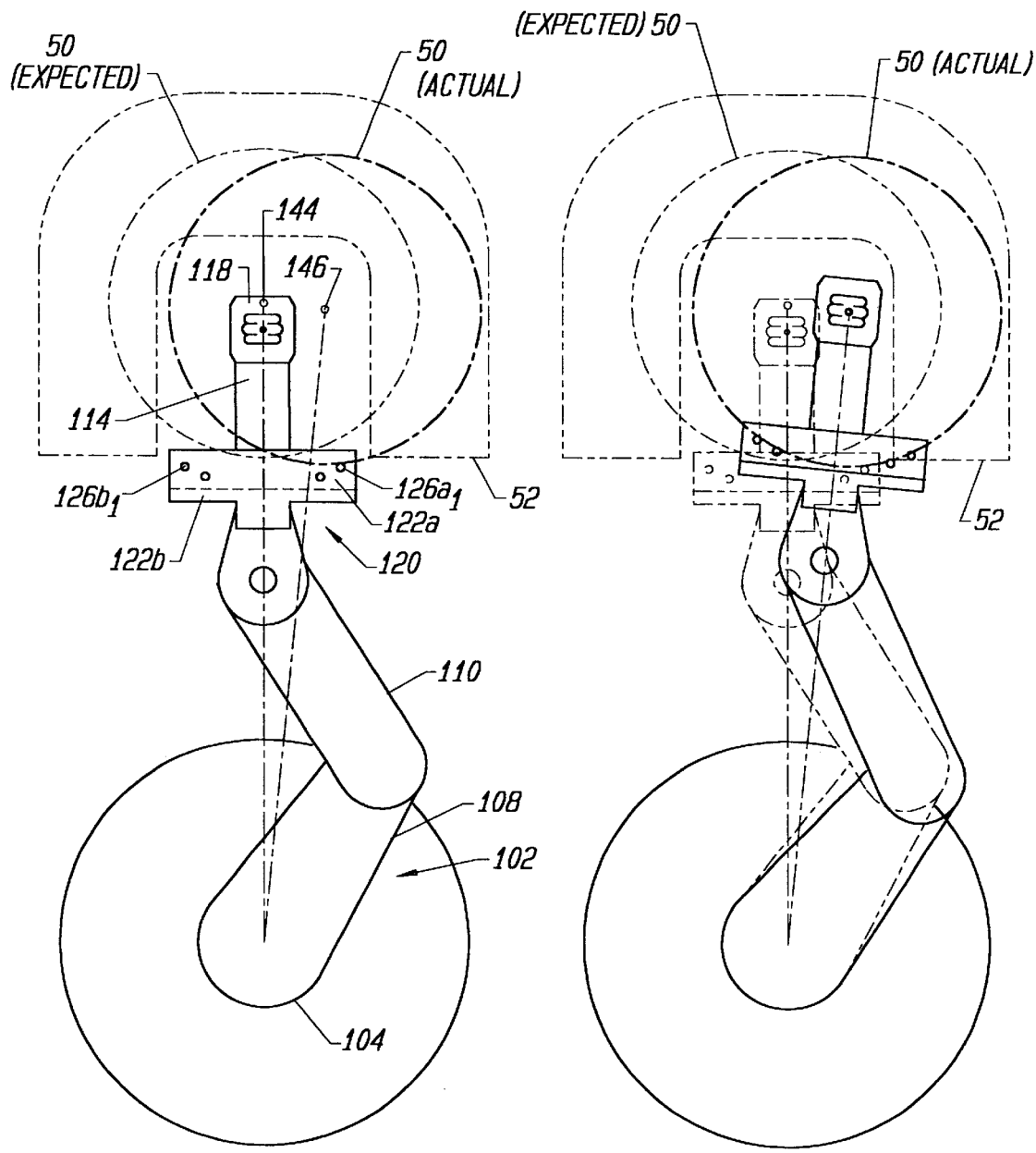
FIG. 9 shows a top view of a wafer handling robot including the system according to the present invention approaching the expected position of a wafer within a cassette.
FIG. 10 shows a top view of a wafer handling robot including the system according to the present invention approaching the actual position of a wafer within a cassette.

The operation of an embodiment of the present invention will now be described with reference to FIGS. 9 and 10 (the components shown in FIGS. 9 and 10 are not drawn to correct proportions). Reference will also be made to operational steps shown in the flowchart of FIG. 13. As shown in FIG. 9, a wafer handling robot 102 approaches a wafer 50 within a cassette 52 in a step 200. The robot 102 is programmed to position the wafer support platform 118 of end effector 114 under an expected center 144 of the wafer to be extracted (i.e., where the center of a wafer would be if the wafer were centered within cassette 52). This expected position of wafer 50 is shown in phantom in FIGS. 9 and 10. However, as discussed in the Background of the Invention, the location of a wafer may vary within a cassette, and the orientation between the wafer and the end effector is not initially known (the offset from center of the wafer 50 within the cassette in FIGS. 9 and 10 is exaggerated for clarity with respect to that which would actually occur within a cassette). As shown in FIG. 9, the actual center of the wafer 50 to be extracted is located at a point 146.

If the wafer 50 was properly centered, all four sensors within the sensor units 122a, 122b would detect the edge of wafer 50 at substantially the same time in a step 202. However, because the actual position of wafer 50 is off center in FIGS. 9 and 10, one of the sensors, sensor $126b_1$, in this example, will detect the edge of wafer 50 before the other sensors. Upon such detection, in a preferred embodiment of the invention, the computer corrects the angle of approach of the end effector by rotating the robot 102 clockwise with respect to the view shown in FIG. 9. Had the wafer 50 been off-center to the left in FIG. 9, sensor unit 122a would have detected the edge of wafer 50 before the sensor unit 122b. In this instance, the computer would have corrected the angle of approach of the end effector by rotating the robot 102 counterclockwise with respect to the view shown in FIG. 9. The specific operation of embodiments of the present invention regarding how d to what extent the angle of approach is corrected will be explained herein with respect to the operation steps 300–306 shown in FIG. 13.

FIG. 10 shows the adjusted position of the end effector 114 under the wafer 50. The original position of wafer handling robot 102 for an expected position of the wafer 50 is shown in phantom. Now that the angle of approach of end effector 114 is aligned with the center of wafer 50, each of the sensors within sensor unit 122a, 122b will detect the edge of the wafer 50 at substantially the same time (un less one of the sensors is aligned with the wafer notch). Owing to the precision of the sensor units, it is unlikely that the sensor units will detect the wafer edge at precisely the same time, even when the angle of approach of the end effector has been corrected within acceptable tolerances to the center of the wafer. There fore, as will be explained in greater detail below, the computer 111 controls the sensor units such that correct alignment is indicated when the sensor units detect the wafer edge at substantially the same time.

In a preferred embodiment, once both sensor units detect the wafer edge at substantially the same time, the end effector retracts away from the cassette approximately 1–5 cm. Referring again to FIGS. 7 and 8, the sensor system 120 as previously de scribed includes an upper portion 128. In order to avoid the possibility that the upper portion 128 will contact the next above adjacent wafer when the end effector rises up to support the wafer to be extracted, the end effector 114 retracts toward the robot so that the end effector may rise up without upper portion 128 contacting the next above adjacent wafer. As indicated in FIG. 8, when the sensors $126a_1$, $126a_2$, $126b_2$, and $126b_1$ are aligned with the outer circumference (if a wafer, the center of the wafer support platform 118 is positioned past the center of the wafer. Thus, when the end effector retracts to prevent contact between the upper portion 128 and the next above adjacent wafer, the wafer support platform is located under the center of the wafer.

In alternative embodiments of the present invention, it is contemplated that the distance between the sensors and the center of the support platform 118 may be substantially equal to the radius of a wafer, such that, once the sensors detect the wafer edge at substantially the same time, the wafer support platform 118 is substantially positioned under the center of the wafer. In any event, as the size of the wafer and the length of the end effector are known, once the sensor units simultaneously encounter the wafer edge, the center of the wafer may be identified and the support platform 118 positioned thereunder.

Certain processing equipment may be able to operate with either 200 mm or 300 mm wafers. For a disclosure of such equipment, see for example U.S. patent application Ser. No. 09/115,526, entitled "Ergonomic, Variable Size, Bottom Opening System Compatible With A Vertical Interface", which application is assigned to the owner of the present invention. It is further contemplated that the sensor system 120 is capable of confirming that the proper size wafer is in act being accessed by the end effector 114. For example, if the process tool is set up to work with 300 mm wafers, and a cassette including 200 mm wafer is loaded thereon, the end effector 114 is able to detect the improper sized wafers as a result of the position at which the end effector first intersects the edge of the wafer. If an improper sized wafer is detected, the process may be halted, and the cassette containing the improper sized wafers removed.

The operation of an embodiment of the present invention for correcting the position of the wafer handling robot when it encounters an off-center wafer will now be described with reference to the schematic representation shown in FIG. 11A. Reference is also made to the steps shown in the flowchart of FIG. 13. Upon approaching a wafer 50, if the wafer is off-center, one of the sensor units, 122a in FIG. 11A, will encounter the edge of the wafer 50 at a time $t_1$. The computer stores the position of the end effector at time $t_1$ in a step 300. At this time, the sensor unit 122b has not yet detected the wafer edge. According to a preferred embodiment of the invention, the end effector may continue to advance under the wafer without changing the angle of approach until the other sensor unit, 122b in this example, detects the wafer edge at a time $t_2$. The computer stores the position of the end effector at time $t_2$ in a step 302. From the stored positions of the end effector, the distance $d_4$ the end effector travelled from detection of the wafer edge by the sensor unit 122a at time $t_1$ to detection of the wafer edge by sensor unit 122b at time $t_2$ may be determined by the computer.

Additionally, the location of the sensor units within the end effector, and the initial angle of approach to of the end effector with respect to a reference axis 148 are also known. From these known properties of the system, the computer may calculate the wafer orientation and the adjusted expected position of the wafer in a step 304 according to known trigonometric principles. Thereafter, the computer may control the robot 102 to rotate to the adjusted angle of approach to align the end effector with the actual center of the wafer in a step 306.

Once the end effector has been adjusted to the actual wafer center, the computer may confirm that the sensor units 122a and 122b detect the wafer edge at substantially the same time. If they do, the end effector may proceed to extract the wafer as described above. If, however, sensor units 122a and 122b still encounter the wafer edge at substantially different times, steps 300–306 may be repeated. The end effector may be aligned with the wafer center within acceptable tolerances even if the sensor units do not detect the wafer edge at precisely the same time. Therefore, in a preferred embodiment of the invention, if the distance $d_4$ is smaller than some predetermined value stored in computer 111, the end effector is considered to be sufficiently aligned with the wafer center, and the end effector may proceed to extract the wafer. In a preferred embodiment, the end effector is considered to be sufficiently aligned with the wafer center for a distance $d_4$ less than or equal to 0.01 inches. This maximum allowable distance for alignment may however vary from approximately zero inches to greater than 0.04 inches in alternative embodiments of the invention.

Figure 11B:
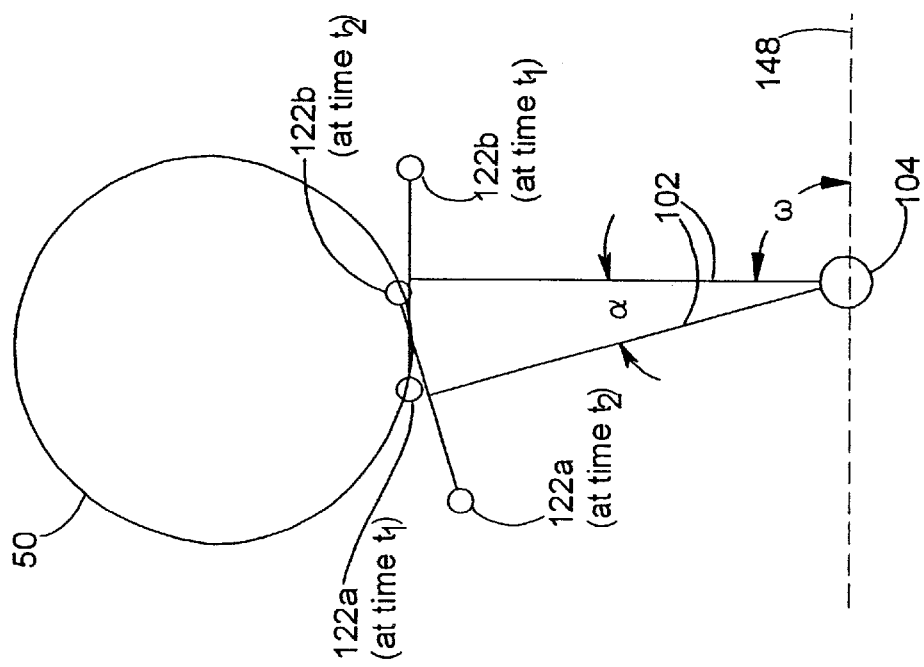
FIG. 11B is a schematic representation of an alternative embodiment for adjusting the position of the end effector to the actual position of the wafer.
Figure 11A:
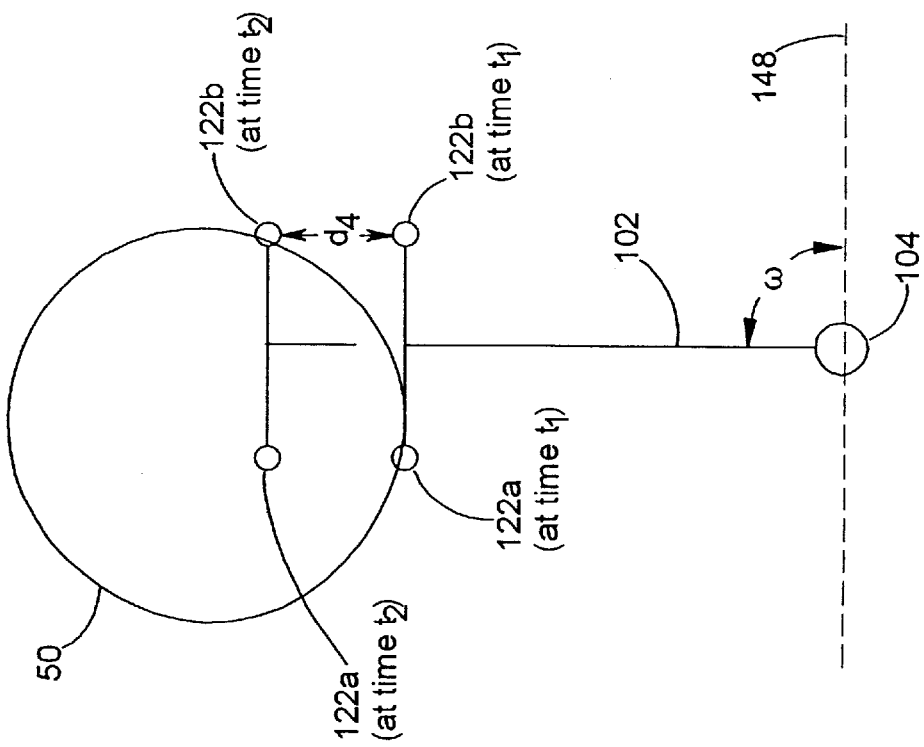
FIG. 11A is a schematic representation of an embodiment for adjusting the position of the end effector to the actual position of the wafer.

In a further embodiment of the invention shown in FIG. 11B, if a wafer is off-center, one of the sensor units, sensor unit 122a in FIG. 11B, will contact the wafer edge at a time $t_1$ prior to the other sensor unit contacting the wafer edge. According to the embodiment shown in FIG. 11B, the computer 111 thereupon stores the end effector position at time $t_1$ in the step 300, and rotates the robot 102 in the direction of the sensor which detected the wafer edge until the other sensor unit contacts the wafer edge at a time $t_2$. The computer then stores the end effector position at time $t_2$ in the step 302. From the stored positions of the end effector, the angle a through which the end effector rotated from detection the wafer edge by the sensor unit 122a at time $t_1$ to detection of the wafer Age by sensor unit 122b at time $t_2$ may be determined by the computer. The computer may thereafter calculate the adjusted expected position of the wafer in a step 304 according to known trigonometric principles as described above, and the computer may control the robot 102 to rotate to the adjusted angle approach to align the end effector with the actual center of the wafer in a step 306. The end effector will be considered to be aligned within acceptable tolerances to the center of the wafer when the angle a is less than or equal to approximately 0.08°. This value may vary in alternative embodiments of the invention.

In a further embodiment of the present invention, upon detection of the wafer edge by one of the sensor units, the computer 111 may control the robot 102 to both advance (FIG. 11A) and to rotate (FIG. 11B) until the other sensor unit comes into contact with the wafer edge. Thereupon the corrected angle of approach of the robot 102 may be calculated as described above.

Figure 13:
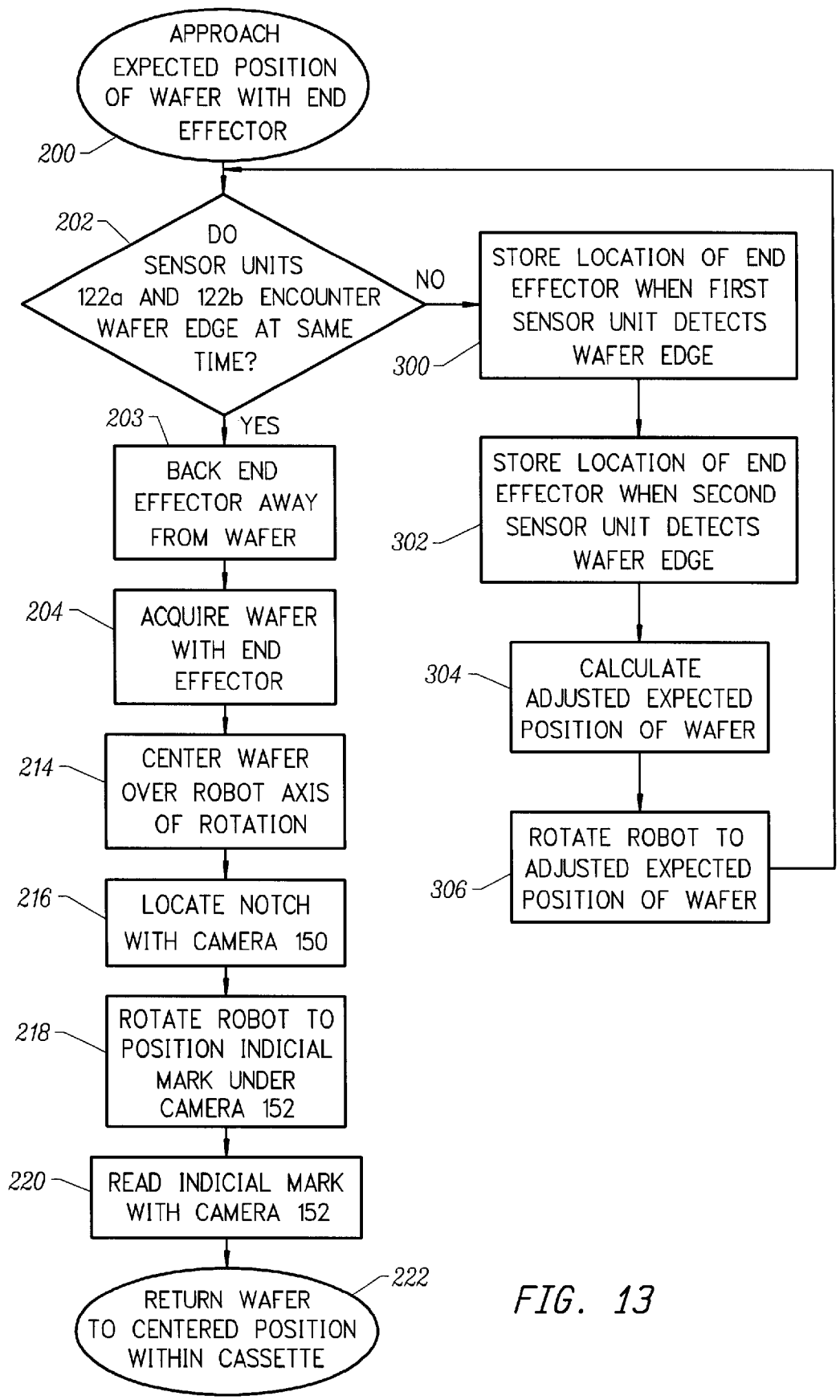
FIG. 13 is a flowchart showing the operation of the system according to the present invention.
Figure 14:
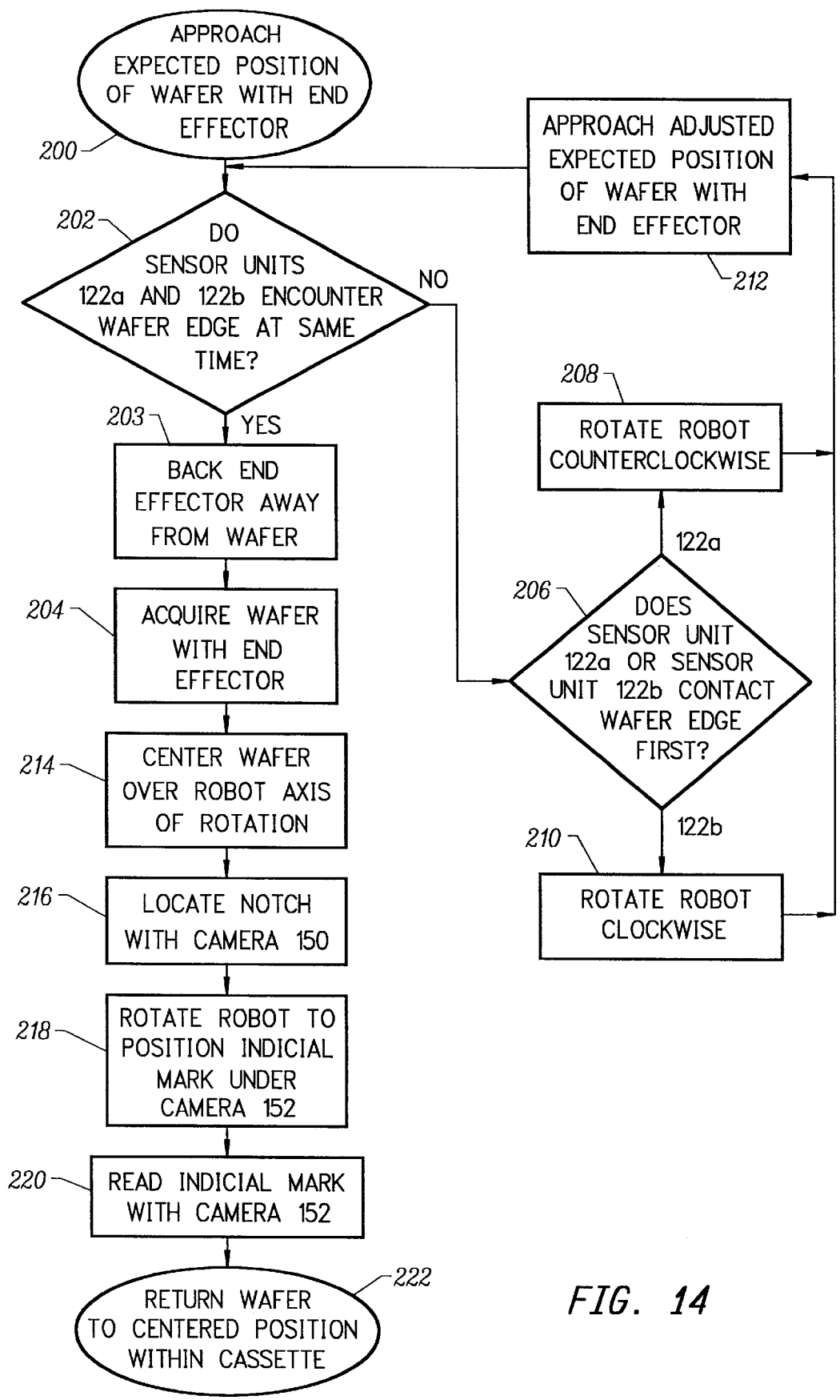
FIG. 14 is a flowchart showing the operation of an alternative embodiment of the system according to the present invention.

A further method of operation for correcting the position of the end effector with respect to the actual center of the wafer is shown in steps 206, 210 and 212 of the flowchart of FIG. 14. The other steps shown in FIG. 14 which are identical to those performed in accordance with the embodiment described with regard to FIG. 13 are denoted with the same reference numerals. In this embodiment, once it has been determined in a step 202 that the sensor units detect the wafer edge at different times, the computer then rotates the end effector either clockwise or counterclockwise toward whichever of the sensor units detected the wafer edge first (steps 208, 210), and again approaches the wafer (step 212). This process is repeated until the sensor units detect the wafer edge at substantially the same time. In steps 208 and 210, the computer may control the robot 102 to rotate a fixed or variable angle each time correction is required until simultaneous edge detection by the sensor units. In one embodiment of the invention described with regard to FIG. 14, the computer may control the robot 102 to rotate through an angle of between 0.05° to 5° for each angle of approach adjustment of the end effector.

Figure 12A:
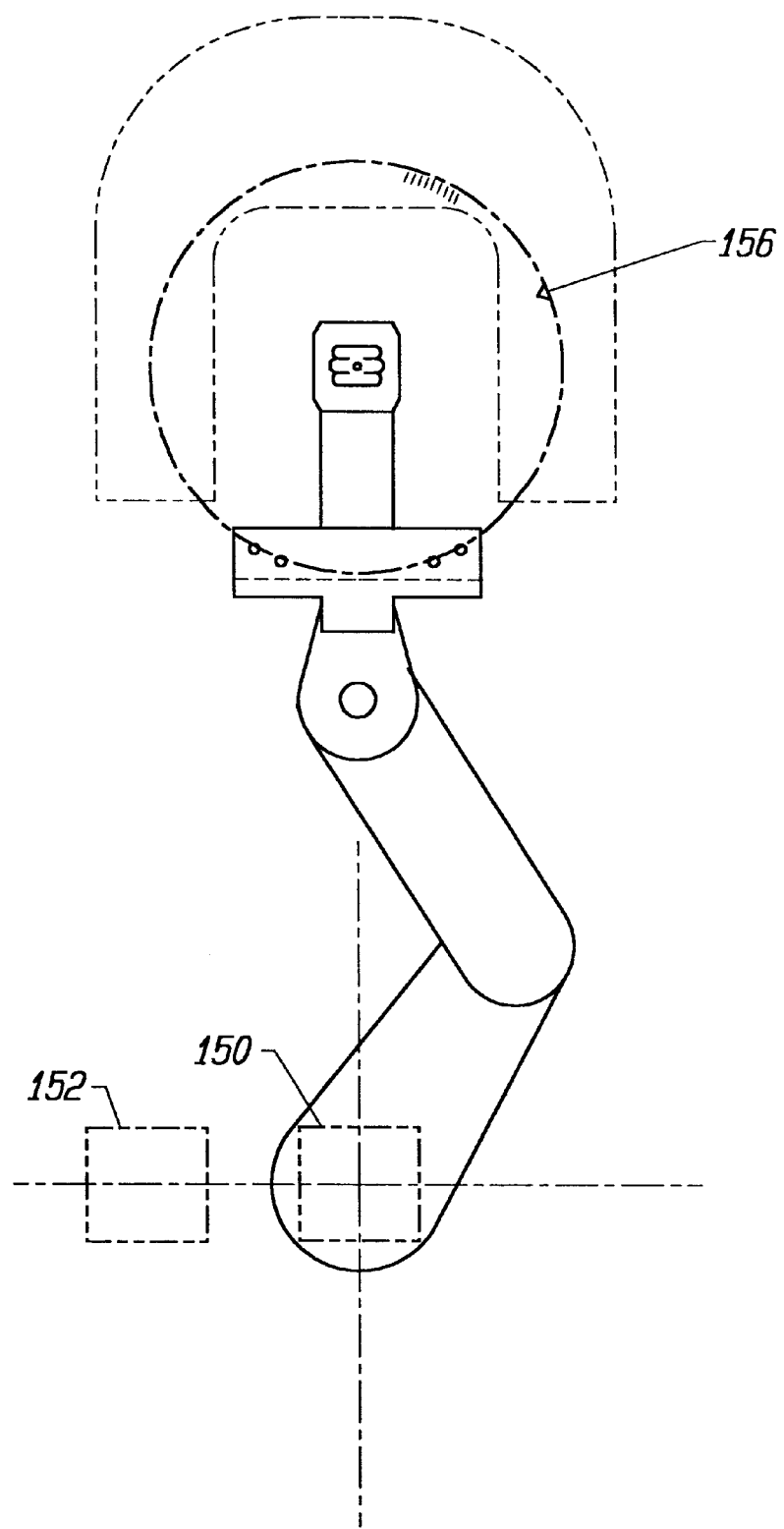
FIGS. 12A–12C show top views of the wafer handling robot according to the present invention extracting a wafer from a cassette and positioning the wafer for reading the indicial mark.
Figure 12B:
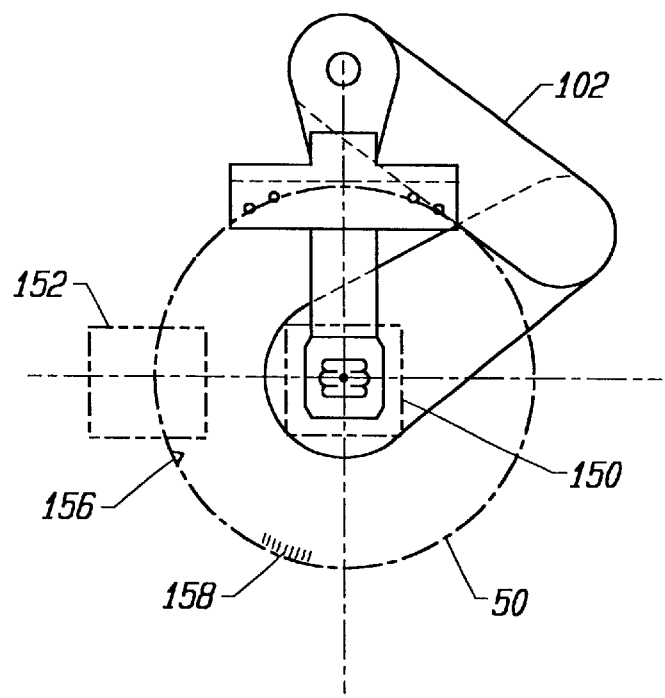

Once the angle of approach of the end effector has been corrected to the center of the wafer, the end effector retracts to center the support platform under the center of the wafer in a step 203 and as shown in FIG. 12A. Thereafter, in an embodiment of the invention, the wafer is withdrawn from the cassette on the end effector and positioned such that the center of the wafer aligns with the z-axis of rotation of the robot 102 in a step 214 and as shown in FIG. 12B. As the center of the wafer is now known, the wafer may be extracted from the cassette without danger of the wafer contacting the sides of the cassette during the wafer extraction.

Embodiments of the present invention further include a first camera 150 and a second camera 152 such as shown in FIGS. 3A, 3B, and 12A–12C. The first camera 150 is preferably secured to an upper surface of the station 100 via conventional fastening means so that the camera 150 is suspended substantially over the z-axis of rotation of the robot 102. In a preferred embodiment, the lens of the camera 150 is suspended approximately 1–2 feet above the highest elevation of the wafer allowed by the robot 102 (i.e., when the shaft 104 is raised to its maximum height). Camera 150 may preferably be a video camera such as for example a charge coupled display (CCD) camera coupled to the computer 111. Such cameras are manufactured for example by Toshiba America C.P., Inc., Information and Imaging Technology Group, Buffalo Grove, Ill. 60089. Camera 150 includes a lens, such as for example a wide angle lens, capable of receiving an image of at least the diameter of the wafer from a height of 1–2 feet. Once the wafer 50 is centered over the z-axis of rotation of the robot 102 in the step 214, the camera 150 receives an image of the wafer 50 including the location of the notch 156. Upon receiving the image, the computer 111 may identify the angular orientation of the notch in a step 216. As would be appreciated by those skilled in the art, camera 150 may comprise other devices capable of reading an image and transferring data representative of the image to a computer. Camera 150 may also comprise a sensor capable of detecting the presence of a deformation such as notch 156 in the circumference of the wafer.

Figure 12C:
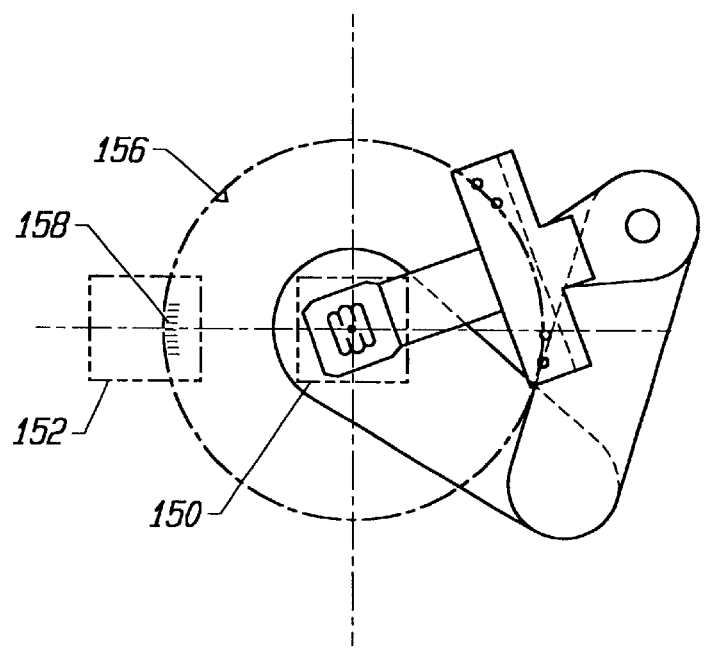

As described in the Background of the Invention section, wafers include an indicial mark 158, which may for example be an OCR mark or a bar code, at a known position with respect to the wafer notch 156. As such, once the wafer center is known and the camera 150 and computer 111 identify the position of the notch 156, the computer may rotate the robot 102 to position the indicial mark 158 under the second camera in a step 218 and as shown in FIG. 12C. The second camera is also coupled to the computer 111, and is preferably a video camera such as for example a CCD camera manufactured by Toshiba America C.P., Inc. as described above. It is understood that camera 152 may comprise other devices capable of reading an image and transferring data representative of the image to a computer. The image read by the CCD camera 152 may be located on either the top or bottom surface of the wafer.

Second camera 152 includes a lens, such as for example a macro lens, capable of scam ling small images with a high degree of resolution. The camera is supported over an outer circumference of the wafer, preferably about 0.5 inches above the wafer. Once the indicial mark is located under the camera 152, camera 152 reads the mark in a step 220 and transfers the image to the computer 111 for processing. As would be appreciated by those skilled in the art, a light source capable of providing light of various wavelengths, various polarizations, various angles of incidence, and various intensities may be provided as part of or adjacent to camera 152 and/or camera 150 to aid in picking up the image of the indicial mark and/or notch.

Camera 152 is supported on a stand 160 (FIG. 3B) mechanically mounted on the floor 106 of the station 100. The stand 160 is spaced away from the axis of rotation of the robot 102 a distance slightly greater than the radius of a wafer being processed so as not to interfere with a wafer as it is rotated over the axis of rotation. The camera is supported on the stand 160 at an elevation of approximately 12 inches above the floor 106 of the station, which elevation is slightly greater than the highest possible elevation of a wafer 50 supported on the robot 102 (which elevation occurs when the shaft 104 is raised to its maximum height). Thus, the camera 152 may be positioned over an outer circumference of a wafer 50, but does not contact the wafer 50.

In an alternative embodiment, one camera may be used to both identify the position of the notch and to read the indicial mark. In this embodiment, the camera, capable of reading an indicial mark as described above, may be positioned approximately ½ inch above the surface of a wafer. In this position, the camera is capable of scanning a small section of the outer circumference of the wafer, such as for example a 20° arc length, at any one time. As such, according to this embodiment, successive arc lengths of the wafer may be scanned until notch is detected, whereupon the computer may control the robot 102 to rotate the wafer to position the indicial mark under the camera. It is further contemplated that this alternative embodiment may operate without a notch 156, such tat successive arc lengths are scanned until the indicial mark itself is detected under the camera.

After the indicial mark has been read in step 220, the end effector returns the wafer to the cassette 52 or to another cassette in a step 222. It is another advantage of the present invention that, as the relative position of the robot 102 and the cassette 52 is known, and as the relative position between wafer 50 and the end effector known, the robot 102 may return the wafer to a predetermined position and/or orientation within the cassette 52 without danger of wafer contact with the side of he cassette. This may be accomplished by placing the wafer on a temporary support, and reorienting the end effector below the wafer. One embodiment for accomplishing this is described below. A further advantage to having a known and repeatable positioning of the wafer on the end effector is that the wafer may be oriented in the process tool in a fixed and repeatable position. Therefore, if desired, devices may be formed in the same orientation on each wafer.

In certain applications, it may be desirable to position a wafer in a predetermined position and/or orientation within a cassette without having to identify an indicia mark. As such, according to an alternative embodiment of the present invention, the wafer may be repositioned within the cassette without removing the wafer from the cassette. In this alternative embodiment, steps 214–220 of the flowchart of FIG. 13 may be omitted such that the end effector may be centered under the wafer 50 as described above, the wafer lifted off of its support surface within the cassette in a step 204, the end effector adjusted to position the wafer at a desired position and/or orientation with respect to the cassette, and the wafer relocated on its support surface in the cassette in a step 222. Alternatively, after the end effector is centered under the wafer 50 as described above, the wafer may be removed from the cassette and placed on a support, the robot and end effector rotated beneath the wafer, and the wafer required in the new position and/or orientation, and the wafer returned to the cassette in the desired position and/or orientation within the cassette. An alternative to such an embodiment is discussed hereinafter.

As the present invention is capable of identifying a wafer center and thereupon centering an end effector with respect to the wafer, all prior to wafer extraction from a cassette, the alignment module conventionally used for these purposes may be omitted from within the clean environment. Omission of the alignment module allows other components to be located within the space otherwise taken up by the module. For example, a second wafer-carrying cassette may be located within the station so that two cassettes are processed in parallel. Alternatively, with room for two cassettes, one cassette may be loaded into or unloaded from the station while the robot 102 is performing the wafer centering/mark reading process on the other cassette. It is further contemplated that with the omission of the alignment module, the overall dimensions of the station may alternatively be reduced. Omission of the alignment module allows the overall space within the clean environment to be reduced by approximately 40%.

Figure 15:
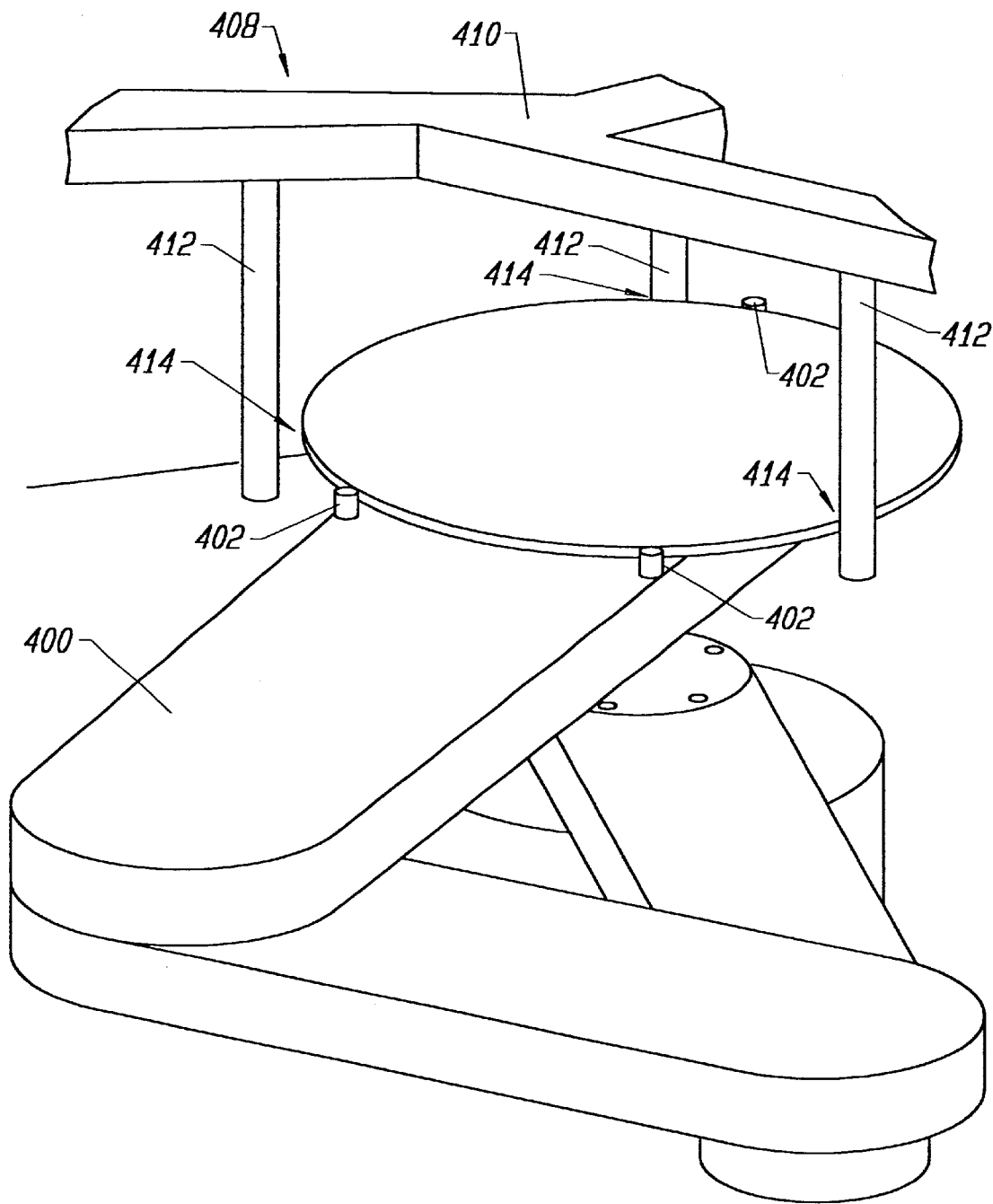
FIG. 15 is a perspective view of an alternative embodiment of the present invention for centering a wafer and identifying an indicial mark while the wafer is gripped at its edges.
Figure 16:
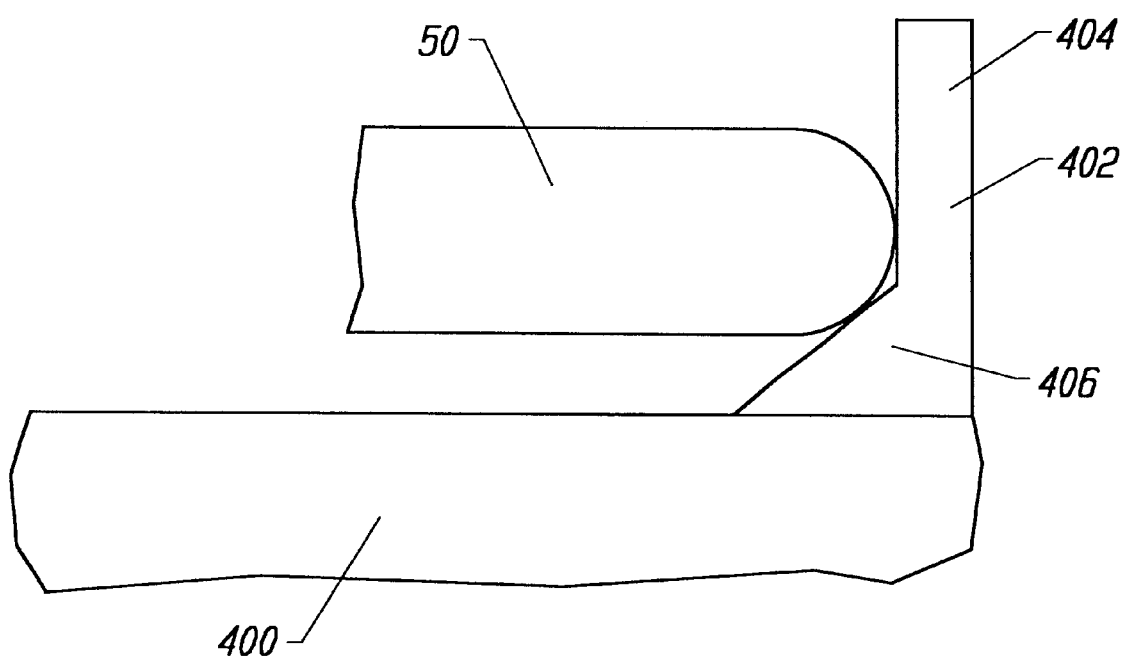
FIG. 16 is a side view of an edge gripper according to the embodiment of the present invention shown in FIG. 15.

It may b advantageous to grip a wafer from its edges. An alternative embodiment of the present invention for centering a wafer on an end effector and for identifying an indicial mark while the wafer is gripped at its edges is shown in FIG. 15. According to the embodiment shown in FIG. 15, wafer handling robot 102 includes an end effector 400 including three edge grips 402. The edge grips are preferably located 120° apart from each other, and have an upper vertical component 404 and an inwardly sloping lower component 406 as shown in FIG. 16. It is understood that the number, orientation with respect to each other and the configuration of the edge grips may vary in alternative embodiments.

The edge grips are provided with a vertical height sufficiently small to fit in between adjacent wafers within a cassette, and to allow the end effector 400 to raise upward under a particular wafer to lift the wafer off of its support shelf and remove the wafer from the cassette. In an alternative embodiment, the end effector may enter a cassette above a particular wafer to be accessed. Thereafter, the end effector may lower down over the wafer to be accessed, one or more of the edge grips 402 may move inward around the edge of the wafer, and the wafer may thereafter lifted and removed from the cassette. [Question: what if the edge grips align with a notch?]

According to a preferred embodiment of the configuration shown in FIG. 15, the end effector includes the sensor system 120, as shown for example in FIG. 7, so that the wafer is centered between the edge grips 402 when the wafer is acquired by the end effector, In such an embodiment, the end effector may enter a cassette under a wafer to be accessed and the sensor system 120 may identify the wafer center as described above. The end effector may then back out of the cassette slightly a preset distance so that the edge grips 402 are centered under and around the edges of the wafer. Thereafter, the end effector may raise upward to grip the wafer at its edges and remove the wafer from the cassette, centered on the edge grips. However it is understood that the sensor system 120 may be omitted from the configuration of FIG. 15 in alternative embodiments.

A CCD or similar type camera as discussed above (not shown) is preferably positioned above and adjacent the wafer cassette so that the position of the notch on the wafer may be identified. Also, in embodiments of the invention not including the sensing system 120, the CCD camera can identify the degree and direction of offset of the wafer with respect to a center of the end effector as the wafer is withdrawn from the cassette.

The embodiment of the invention shown in FIG. 15 further includes a handoff claw assembly 408 positioned over the central axis of rotation of the robot 102. The height of the handoff claw assembly 408 is provided to be above the height of the robot 102 in its fully extended position along the Z-axis. The assembly 408 includes a frame 410 stationarily mounted with respect to the processing station 100 (affixed either to a side, bottom or top wall of the station), and a plurality of claws 412 extending downward from the frame 410. In a preferred embodiment, there are three claws 412, positioned 120° from each other, and space apart sufficiently for a wafer 50 to fit therebetween. A bottom portion of each of the claws 412 includes a notch 414 for receiving and gripping a wafer. The notches 414 are located at an elevation so that when the robot is in its fully extended position along the Z-axis, the wafer lies in the same plane as each of the notches 414. It is understood that the height of the notches may correspond to position of a wafer at less than the fully extended vertical position of the robot in alternative embodiments.

In a prefer embodiment, two of the claws may be fixedly mounted to the frame 410, while a third is capable of translation toward and away from the central axis of rotation of the robot. In operation, after a wafer has been picked up at its edges by end effector 400, and the position of notch has been identified by the CCD camera, the wafer is moved over the central axis of rotation of the robot and rise upward until the wafer lies in the plane of the notches 414. At that point, the wafer is handed off to claws 412. In a preferred embodiment, once the wafer is at the desired height, the robot moves horizontally to seat the wafer within the notches 414 of the two stationary claws. Thereafter, the third, translating claw may move inward so that the wafer is then securely grasped by the three claws. The three claws are preferably compliant. They may be formed of an elastically deformable material, or the claws may be affixed to the frame 410 by an elastically deformable material. Further still, the elastically deformable material may be located within the notches 414, or as opposed to an elastic material, each of the claws may be spring loaded. It is also contemplated that the fingers not be compliant in alternative embodiments.

After the wafer is gripped by the handoff claw assembly 408, the robot 102 rotates with the end effector centered over the axis of rotation of the robot. Once the wafer notch is located in the desired position with respect to the end effector, the wafer is then required by the end effector from the claws. As indicated above, when the wafer is removed from the cassette, the CCD camera locates the posit of the notch on the wafer. From that, it is known through what angle the end effector must rotate in order that the notch be located in the desired position once the wafer is required by the end effector.

After the above process, with the wafer centered on the end effector and the notch in the desired position, the indicial mark on the wafer is located in a known position and may be read. A second CCD camera 416 is provided for this purpose. It is also contemplated that the indicial mark be read before the wafer is reoriented on and effector as described above. The indicial mark is in general provided on the upper surface of the wafers. However, it is also known to provide indicial marks on a lower surface of the wafers. Therefore, the camera 416 may be mounted to the frame 410, or otherwise supported within the process station above and/or below the wafer viewing point. It is further understood that the camera 152 of the previously described embodiments may be located above and/or below the wafer viewing point. Once the indicial mark has been read, the end effector 400 may return the wafer to the cassette. The handoff claw assembly 408 allows the wafer to be required by the end effector 400 in a known orientation so that the wafer may be returned to the cassette or transferred to the process tool in a known orientation and centered position.

Assuming that each of the edge grips 402 on end effector 400 and claws 412 on frame 410 are 120° offset from each other, there will be three initial positions of the notch relative the end effector where the edge grips and claws could potentially interfere with each other when the end effector goes to require the wafer. Namely, after the end effector has handed off the wafer to the claws and rotated to establish the desired orientation between the end effector and wafer, it is possible that the edge grips will line up along the same vertical axes as the claws, thus preventing requisition of the wafer by the end effector. The control system of the present invention may avoid this interference as follows. When the CCD camera initially determines the position of the notch relative to the effector upon removal of the wafer from the wafer cassette, if the camera senses that the notch is in one of the three known interference positions, the control system may cause the robot to rotate a predetermined interference of set angle after the wafer is centered over the robot axis of rotation and before the wafer is handed off to the handoff claw. The predetermined interference offset angle may be for example 90°, but other offset angles (beside 120°) are contemplated.

After the robot has rotated the wafer through the interference offset angle, the wafer my be handed off to the handoff claw assembly as described above. The end effector then rotates in preparation for requiring the wafer with the notch at the desired orientation. In the event the control system initially sensed an interfere position and accordingly rotated the end effector through the interference offset angle, the rotation of the end effector to require the wafer would be altered, either positively or negatively, by the interference offset angle so that the end effector requires the wafer with the notch and indicial mark in the proper location.

Although a preferred embodiment of the handoff claw assembly 408 has been described above, it is understood that several alternative configurations are contemplated. For example, in one such alternative, each of the claws 412 may be capable of translation on the frame 410 toward and away from the central axis of rotation of the robot. In such an embodiment, the wafer is raised to the plane of the notches 414 in each claw, and then each claw is actuated inward to grip the wafer edges. Furthermore, each of the claws may be spring loaded with an equal spring force in each. Therefore, if the claws initially grip a wafer that has not been centered over the robot axis of rotation, the springs associated with each claw will together center the wafer so that each spring exerts an equal force on the wafer.

As a further alternative embodiment, although it is described above that the wafer is held stationary by the handoff claw assembly while the end effector rotates, it is understood that the wafer may be rotated by the handoff claw while the end effector remains stationary. In one such embodiment, a plate (not shown) may Me rotationally mounted to the frame 410. The claws 412 may be mounted to a lower surface of the plate, spaced 120° apart from each other, and extending downward as in the embodiment shown in FIG. 15. In operation, after the CCD camera identifies the wafer notch position, the end effector 400 may hand the wafer off to the claws 412 as described above. Thereafter, the plate may be rotated to position the notch and indicial mark in the proper location, and the end effector may then require the wafer. Configurations other than a plate are contemplated. In further embodiments of the invention, it is understood that both the claws 412 and the end effector 400 may rotate to orient the wafer on the end effector as desired in alternative embodiments.

The preferred embodiment of the invention shown in FIG. 15 and described above includes an end effector having edge grips 402 and a sensor system 120, as well as the handoff claw assembly 408 for allowing a wafer to be reoriented on the end effector. In an alternative embodiment of the present invention, it is understood that the handoff claw assembly 408 may be omitted. In such an embodiment, the present invention would operate as described above with respect to FIGS. 3A–14 with the addition of the edge grips 402 on the end effector. Additionally, it is understood that an embodiment may include the sensor system and handoff assembly, but that the edge grips 402 may be omitted. In such an embodiment, the end effector 114 as shown for example in FIGS. 5–7 may be used to pick up a wafer on center from its bottom surface, and then hand it off to the handoff claw assembly 408 as the end effector repositions itself to require the wafer in the proper orientation with respect to the end effector.

The wafer handling robot 22 described thus far has been mounted to the base of the station 20. In an alternative embodiment of the invention (not shown), the robot 22 may be turned upside down so that the base of the robot 22 is mounted though a top of the station 20. Such an embodiment may include an end effector 114 as described above for entering below a wafer to be accessed and supporting the wafer from its bottom surface. The robot may alternatively include an end effector 400 including edge grips 402 for supporting a wafer from its edges. The end effector 400 may be configured to enter either above or below a wafer to be accessed. The embodiment of the present invention including a top-mounted robot including an end effector for entering above a wafer may be well suited for working with wafers having indicial marks on a bottom surface of the wafer. In this instance, there is never a danger that the end effector will cover the indica mark and prevent reading of the mark without having to first reposition the wafer. In embodiments of the present invention including a top-mounted robot, a handoff claw assembly 408 may be provided near a bottom of the station 20 and having claws which extend upward to receive the wafer while the end effector rotates to establish the desired orientation of the wafer on the end effector upon requisitioner of the wafer.

Although the invention has been described in detail herein, it should be understood that the invention is not limited to the embodiments herein disclosed. For example, while embodiments of the present invention have been described with respect to centering a support tool under a wafer in a cassette, it is understood that embodiments of the present invention may be used to position a support tool under a workpiece which is supported on a surface outside of a cassette. Moreover, embodiments of the present invention may be used to position a support tool at other than the center of a workpiece. Various other changes, substitutions and modifications may be made thereto by those skilled in the art without departing from the spirit or scope of the invention as described and deformed by the appended claims.

We claim:

1. A method for adjusting a relative position between a workpiece having a notch and a support tool adapted to support the workpiece, the method comprising the steps of:

providing a plurality of sensors on the support tool, each pair of adjacent sensors being separated by a distance at least as great as arc length of the notch;

moving the support tool toward the workpiece on the support surface;

sensing an edge of the workpiece with at least one of the sensors; and adjusting the relative position between the workpiece and the support tool until at least three of the sensors detect the edge.

2. A method according to claim 1, further comprising the steps of:

supporting the workpiece on the support tool with the support tool in the adjusted relative position; and transporting the workpiece away from the support surface.

3. A method according to claim 1, wherein the step of adjusting the relative position between the workpiece and the support tool comprises the steps of:

sensing when each sensor on the support tool intersects with the edge of the workpiece; and calculating the relative position of the support tool with respect to the workpiece.

4. A method according to claim 3, further comprising the step of using the calculated relative position to adjust the relative position of the support tool with respect to the workpiece.

5. A method according to claim 1, wherein the step of adjusting the relative position between the workpiece and the support tool comprises the steps of:

sensing When one of the sensors on the support tool intersects with the edge of the workpiece;

rotating the support tool toward the point on the edge of the workpiece with which the sensor intersected; and sensing when three of the sensors on the support surface intersect with the edge of the workpiece upon rotating the support tool.

6. The method for determining a relative position between a workpiece and a support surface as recited in claim 3, further comprising the steps of:

(g) positioning a center of the wafer over an axis of rotation of the wafer handling robot;

(h) sensing a location of an indicial mark provided on the wafer;

(i) rotating the wafer to position the indicial mark under an indicial mark reader by rotating the wafer handling robot with the center of the wafer aligned with the axis of rotation of the wafer handling robot; and (j) reading the indicial mark.

7. The method for determining a relative position between a workpiece and a support surface as recited in claim 6, further comprising the step of reorienting the wafer on the end effector at some point after said step (f) of transporting the wafer out of the cassette.

8. The method for determining a relative position between a workpiece and a support surface as recited in claim 6, further comprising the step of returning the wafer to the cassette in a predetermined position with respect to the cassette.

9. A method according to claim 2, further comprising the steps of:

moving the workpiece to a predetermined position with respect to the support surface while the workpiece is supported on the support tool; and returning the workpiece to the support surface in the adjusted relative position with respect to the support surface.

10. A method according to claim 2, wherein the support tool comprises an end effector including a blade for supporting the workpiece from an underside of the workpiece.

11. The method for determining a relative position between a workpiece and a support surface as recited in claim 2, wherein in step (f) the support tool comprises an end effector including a plurality of edge grips for gripping the workpiece at edges of the workpiece.

12. A method for adjusting a relative position between a rounded workpiece supported on a support surface and a support tool adapted to support the rounded workpiece, the method comprising the steps of:

providing a plurality of sensors on the support tool, the sensors configured so as to form an arc having a curvature similar to the curvature of an edge of the rounded workpiece and having an arc length no greater than half the circumference of said edge;

moving the support tool toward the rounded workpiece on the support surface;

sensing when a first of the plurality of sensors intersects with the edge of the rounded workpiece; and adjusting the relative position between the rounded workpiece and the support tool until three of the sensors detect the edge.

13. A method according to claim 12, wherein the step of adjusting the relative position between the rounded workpiece and the support tool comprises the steps of:

storing a first position of the support tool upon intersection of the first sensor on the support tool with the edge of the rounded workpiece;

storing a second position of the support tool upon intersection of a second sensor on the support tool with the edge of the rounded workpiece; and calculating the position of the support tool with respect to the rounded workpiecce based on the stored first and second positions of the support tool.

14. A method according to claim 12, wherein said support tool moves linearly toward the workpiece along a longitudinal axis, further comprising the step of continuing to move along the longitudinal axis after the intersection of the first sensor on the support tool with the rounded edge of the workpiece until the intersection of a second sensor on the support tool with the edge of the workpiece.

15. A method according to claim 14, further comprising the step of rotating the support tool with respect to the longitudinal axis until both the first and second sensors on the support tool intersect with the edge of the rounded workpiece.

16. A method according to claim 14, wherein the step of adjusting the relative position between the rounded workpiece and the support tool further comprises the step of translating the support tool with respect to the longitudinal axis.

17. A method for positioning an end effector of a wafer handing robot in a predetermined position with respect to a notched semiconductor wafer, comprising the steps of:

providing a plurality of sensors on the end effector, the sensors forming an arc having a curvature similar to that of the wafer and separated by a distance at least as great as the arc length of the notch in the wafer;

moving the end effector toward the wafer;

sensing when a first sensor of the end effector intersects an edge of the wafer; and adjusting the position of the end effector with respect to the wafer until three of the sensors intersects the edge.

18. A method for engaging a transportation member with a wafer, comprising the steps of:

(a) providing a plurality of n sensors connected to the transportation member, said sensors being configured so as to form an arc having a curvature similar to the curvature of the edge of the wafer;

(b) adjusting the position of the transportation member until n−1 sensors detect the edge of the wafer; and (c) engaging the transportation member with the wafer after said step (b).

19. A method according to claim 18, wherein said step (c) comprises engaging an end effector with the wafer, the end effector including a blade.

20. A method according to claim 18, wherein said step (b) comprises the steps of:

(i) storing a first position of the transportation member upon the intersection of a first sensor with the edge of the wafer;

(ii) storing a second position of the transportation member upon intersection of a second sensor with the edge of the wafer; and (iii) calculating the position of the transportation member with respect to the wafer based on the stored first and second positions.

21. A method according to claim 18, further comprising the step of moving said transportation member linearly along a longitudinal axis after the intersection of the first sensor with the edge of the wafer until the intersection of a second sensor with the edge of the wafer.

22. A method according to claim 21, further comprising the step of rotating the transportation number with respect to the longitudinal axis until the intersection of both the first and second sensors on the support tool with the edge of the wafer.

* * * * *